(12) United States Patent
Gu

(10) Patent No.: US 6,238,514 B1
(45) Date of Patent: May 29, 2001

(54) APPARATUS AND METHOD FOR REMOVING CONDENSABLE ALUMINUM VAPOR FROM ALUMINUM ETCH EFFLUENT

(75) Inventor: Youfan Gu, Boulder, CO (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 09/489,374

(22) Filed: Jan. 21, 2000

Related U.S. Application Data

(63) Continuation-in-part of application No. 09/250,928, filed on Feb. 18, 1999.

(51) Int. Cl.$^7$ ............................. H05H 1/00; C23C 16/00

(52) U.S. Cl. ............................................ 156/345; 118/715

(58) Field of Search ........................... 118/715; 156/345; 55/522, 525, 527, 323, 269; 95/45, 56; 261/101, 75, 100

(56) References Cited

U.S. PATENT DOCUMENTS

| | | | |
|---|---|---|---|
| 1,920,800 | 8/1933 | McCausland | 257/247 |
| 3,785,121 | 1/1974 | Phelps | 55/53 |
| 3,802,497 | 4/1974 | Kümmell et al. | 165/158 |
| 3,865,929 | 2/1975 | Ehlig | 423/488 |
| 3,910,347 | 10/1975 | Woebcke | 165/142 |
| 3,956,061 | 5/1976 | Young et al. | 159/48 |
| 4,374,811 | 2/1983 | Karger et al. | 423/240 |
| 4,487,618 * | 12/1984 | Mann | 55/323 |
| 4,613,485 | 9/1986 | Parry et al. | 422/173 |
| 4,739,787 | 4/1988 | Stoltenberg | 137/14 |

(List continued on next page.)

FOREIGN PATENT DOCUMENTS

| | | | |
|---|---|---|---|
| 1-218013 | 8/1989 | (JP) . | |
| 1-318231 | 12/1989 | (JP) . | |
| 2-25573 | 1/1990 | (JP) . | |
| 2-9408 | 1/1990 | (JP) . | |
| 2-59002 | 2/1990 | (JP) . | |
| 2-61067 | 3/1990 | (JP) . | |
| 2-111403 | 4/1990 | (JP) . | |
| 3-229609 | 10/1991 | (JP) . | |
| 03229609A * | 10/1991 | (JP) | C23C/16/44 |
| 4-150903 | 5/1992 | (JP) . | |

OTHER PUBLICATIONS

"Foreline Traps," *Nor–Cal Products*, Nor–Cal Products, Inc., May 1990, pp. 1–24.
"Vacuum Inlet Traps and Oil Mist Eliminators," MV Products, A Division of Mass–Vac, Inc., seven pages, No Date Available.

*Primary Examiner*—Gregory Mills
*Assistant Examiner*—P. Hassanzadeh
(74) *Attorney, Agent, or Firm*—James R. Young; Chrisman, Bynum & Johnson

(57) ABSTRACT

The present invention provides an improved aluminum chloride trap having a disposable element, wherein the disposable element contains trapping media for condensing, solidifying and trapping condensable aluminum chloride vapor. The trap is designed such that the disposable element may be easily removed for rapid and safe disposal of condensed aluminum chloride solids and subsequently replaced with a new disposable element. The disposable element efficiently traps condensable aluminum chloride vapor from an aluminum etch system without the need for internal or external cooling means, such that condensable aluminum chloride vapor is prevented from condensing and depositing on the interior walls of the trap or on the interior walls of a vacuum conduit system used in an aluminum etch system. The improved aluminum chloride trap of this invention eliminates the hazardous conditions associated with removing condensed aluminum chloride solids from the interior surfaces of the trap and from the interior walls of a vacuum conduit system of an aluminum etch system.

35 Claims, 13 Drawing Sheets

U.S. PATENT DOCUMENTS

| | | | |
|---|---|---|---|
| 5,048,601 | 9/1991 | Yamaguchi et al. | 165/140 |
| 5,141,714 | 8/1992 | Obuchi et al. | 422/174 |
| 5,161,605 | 11/1992 | Gutlhuber | 165/1 |
| 5,405,445 | 4/1995 | Kumada et al. | 118/719 |
| 5,422,081 | 6/1995 | Miyagi et al. | 422/170 |
| 5,728,602 | 3/1998 | Bellows et al. | 437/225 |
| 5,776,216 | 7/1998 | Yang | 55/385.1 |
| 5,800,616 | 9/1998 | Persyn | 118/719 |
| 5,814,377 | 9/1998 | Robles et al. | 527/579 |
| 5,817,566 | 10/1998 | Jang et al. | 438/424 |
| 5,817,578 | 10/1998 | Ogawa | 438/714 |
| 5,820,641 * | 10/1998 | Gu et al. | 55/269 |
| 5,827,370 | 10/1998 | Gu | 118/715 |
| 5,830,279 | 11/1998 | Hackenberg | 134/1.1 |
| 5,833,425 | 11/1998 | Jeon et al. | 414/217 |
| 5,834,846 | 11/1998 | Shinriki et al. | 257/754 |
| 5,855,651 * | 1/1999 | Kurita et al. | 95/280 |

* cited by examiner

APPARATUS AND METHOD FOR REMOVING CONDENSABLE ALUMINUM VAPOR FROM ALUMINUM ETCH EFFLUENT

RELATED APPLICATIONS

This application is a Continuation-in-Part of U.S. patent application Ser. No. 09/250,928, filed Feb. 18, 1999, and entitled "Method and Apparatus for Controlling Polymerized TEOS Build-Up in Vacuum Pump Lines."

BACKGROUND OF THE INVENTION

1. Field of the Invention

This invention relates generally to traps for collecting and removing condensable aluminum chloride vapor from a gas stream to control the build-up of aluminum chloride in vacuum pump lines, valves, and other components downstream from aluminum etching chambers, and more particularly to an improved aluminum chloride trap containing a disposable element for cooling and condensing condensable aluminum chloride vapor byproducts from an aluminum etch system and retaining the condensed aluminum chloride solids within the disposable element, wherein the disposable element can be easily and quickly removed for the safe and rapid removal and disposal of the condensed aluminum chloride solids.

2. Description of the Prior Art

In a typical aluminum etching process for producing components for semiconductor devices, a silicon wafer or other substrate having a film of aluminum on its top surface is positioned in a reaction chamber, and the chamber is evacuated to a vacuum of about 10 millitorr via a turbo pump and a mechanical pump which are connected to a reaction chamber via a foreline. A photoresist having a particular pattern is placed on the aluminum surface to protect part of the aluminum film. The exposed part of the aluminum film that is not protected by the photoresist is then etched by employing a reactive, chlorine-containing gas such as chlorine ($Cl_2$) or boron trichloride ($BCl_3$). Typically, the etching reaction is plasma-enhanced, where the reaction between the chlorine-containing gas and the aluminum film is enhanced by applying rf power to the reaction chamber to create a plasma comprising the atomic constituents of the reactive gas in high energy states in the chamber. The generation of the plasma also causes the reaction chamber to heat up, typically to a temperature of 100 to 150° C. The plasma-assisted reaction between the aluminum film and the chlorine-containing reaction gas etches aluminum from the exposed areas of the aluminum film, resulting in the formation of condensable aluminum chloride vapor ($AlCl_3$) byproducts. The reaction chamber effluent, which contains the condensable aluminum chloride vapor in addition to excess chlorine-containing reaction gas, is then removed from the reaction chamber by an applied vacuum from a vacuum pump. An exhaust line leading from the vacuum pump then directs the effluent to a scrubber, where the condensable aluminum chloride vapor and any excess chlorinated reaction gases are destroyed. A wet scrubber is often employed to treat the effluent with water to remove the condensable aluminum chloride vapor and excess chlorinated reaction gas from the effluent. Alternatively, a dry scrubber may be employed to destroy excess chlorine-containing reaction gases from the effluent, however, the dry scrubber is not able to destroy the condensable aluminum chloride vapor byproduct.

The condensable aluminum chloride vapor byproduct in the conventional aluminum etching systems described above cause problems downstream from the reaction chamber, because they condense, solidify, and deposit upon contact with cool surfaces, such as the cooler interior surfaces of the vacuum forelines and exhaust lines that are used to convey the effluent gas away from the reaction chambers, as well as in other components of the vacuum conduit system of the etching system. Such buildup of solid aluminum chloride downstream from the etching chamber can partially or even entirely clog the pipes, thus reducing vacuum conductance, and can cause piping, pumps, scrubbers and other equipment used in the etching system to be functionally impaired or inoperative and in need of frequent maintenance. Solid aluminum chloride buildup can also flake apart and fall off the piping surfaces and migrate back into the reaction process chamber to become a source of contamination in the semiconductor device manufacturing process.

Typically, the vacuum in the foreline of an aluminum etching system is approximately 500 millitorr, and consequently it is necessary to heat the forelines to a temperature of about 70° C. in order to keep condensable aluminum chloride vapor in the vapor phase so that the condensable aluminum chloride vapor can be removed from the chamber and the foreline by the applied vacuum. However, the pressure in the exhaust line between the pump and the scrubber is typically 760 torr, and therefore it is necessary to heat the exhaust lines to even higher temperatures, typically around 105° C., to keep the condensable aluminum chloride vapor in the vapor phase as the effluent flows through the exhaust lines. If either the foreline, the exhaust line, or both are not maintained at the proper temperature, the condensable aluminum chloride vapor will cool, condense, and solidify, and the condensed aluminum chloride solids will build up along the interior surfaces of the vacuum conduit system, resulting in the diminished function or clogging of the vacuum source.

In order to prevent condensation and solidification and build-up of condensed aluminum chloride solids in the forelines and exhaust lines in aluminum etching systems, heater jackets can be wrapped around such piping to maintain the forelines and exhaust lines at an elevated temperature, thereby preventing condensation and solidification of condensable aluminum chloride vapor on the inside surfaces of such piping. However, depending on the length of the forelines and exhaust lines in the etching system, the use of heating jackets can be quite costly. For example, in some etching systems the reaction chamber may be located on one floor of a building while the vacuum pump and scrubber may be located one or more floors above or below the reaction chamber. Consequently, the foreline, the exhaust line, or both may be 10 feet or longer. In such situations, the use of heating jackets could be cost prohibitive. Therefore, as a less costly alternative, heating tape is often used in place of heating jackets to heat the forelines and exhaust lines. However, the use of heating tape also has drawbacks in that it can be difficult to completely and effectively wrap the lines, and consequently gaps are often left between sections of the heating tape. Such gaps between sections of heating tape on a poorly wrapped pipe result in "cold spots," where the condensable aluminum chloride vapor condenses on the inside of the pipe.

Additional measures used to control the buildup of solid aluminum chloride in vacuum forelines and exhaust lines in vacuum systems of etching systems can include installing a trap just after the heated section of the piping line for trapping and removing aluminum chloride vapors from the effluent gas flow. As a result, the condensable aluminum chloride vapor is condensed and collected in the trap instead of depositing and building up in the piping lines. The trap can then be removed from the piping line whenever necessary for cleaning and removal of the deposited solid aluminum chloride.

The use of traps to remove condensable vapor from piping lines is well-known in the art. Conventional traps for trapping condensable vapor are often designed on the principle that lowering the temperature of the condensable vapor in the trap will cause the condensable vapor to condense as a solid. For example, U.S. Pat. No. 5,422,081, issued to Miyagi et al., discloses a trap device for a vapor phase reaction apparatus having an adjustable number of interior surfaces upon which the condensable aluminum chloride vapor cools on contact with the interior surfaces and condense on such surfaces. However, the Miyagi et al. trap requires a plurality of plate-shaped members assembled in layers, which can be difficult and time-consuming to manufacture and assemble. In addition, the large number of parts makes the Miyagi et al. trap difficult and time-consuming to disassemble for cleaning and removal of condensed aluminum chloride solids. Further, the close proximity between the plate-shaped members and the intake opening can cause the trap to clog prematurely, thus wasting a significant portion of the trap's volume.

Nor-Cal, Inc., of Yreka, Calif., has developed and manufactured a number of water-cooled traps for semiconductor processing equipment, including traps having coaxial and right angle configurations between the entrance ports to the traps and the exit ports to the traps. In the FTWA and FTWS series of traps manufactured by Nor-Cal, Inc., baffles redirect the gas flow between cooling coil tubes arranged cylindrically to increase the surface area for condensation of the condensable vapor flowing through the trap. Gas flowing into the trap is redirected either ninety degrees or one hundred eighty degrees by impacting either an interior surface of the trap or a cooling coil tube located in the trap. However, the Nor-Cal, Inc. trap, similar to many other conventional traps, becomes clogged near the entrance pipe to the trap, which results in low capacity and the need for frequent maintenance and cleaning.

U.S. Pat. No. 5,820,641 to Gu et al. describes a liquid cooled trap for collecting condensable vapor in a chemical vapor reaction system that comprises a first stage, which is a very poor heat exchanger, in order to avoid condensation of the vapor and the resulting solid deposits that could clog the entrance port to the trap, and a second stage which is a good heat exchanger and comprises cooling coil tubes and cooling cones or fins. However, due to the expense of the cooling coil tubes and cooling cones in the Gu et al. trap, the trap cannot be discarded when removal of the build-up of aluminum chloride is necessary. Therefore economic considerations require cleaning of the deposition surfaces in the Gu et al. trap so that the trap can be reused.

Since it is difficult to maintain all parts of an entire vacuum conduit system of an aluminum etching system at the proper temperature or to efficiently trap condensable aluminum chloride vapor with conventional traps, the buildup of solid aluminum chloride will inevitably occur throughout the vacuum conduit system of an aluminum etch system. Thus, at some point, the vacuum conduit system will require cleaning to remove the buildup of condensed aluminum chloride solids. This cleaning is usually carried out using water which, when contacted with aluminum chloride, results in the generation of tremendous amounts of toxic and corrosive hydrogen chloride (HCl) fumes and also generates a large amount of heat, both of which create hazardous conditions for workers.

Consequently, in spite of the heating jackets, heating tape, and various types of aluminum chloride traps already available, there is still a need for an improved trap that condenses and collects condensable aluminum chloride vapor produced in aluminum etching systems in an efficient manner and which allows for safer, easier, and more rapid removal and disposal of the deposited aluminum chloride solids from the trap, especially if such removal and disposal could eliminate the need to clean solid aluminum chloride deposits from deposition surfaces in such traps and from pipes in the vacuum forelines and exhaust lines of aluminum etch systems.

SUMMARY OF THE INVENTION

Accordingly, it is a general object of the present invention to provide an improved trap for aluminum etching systems wherein condensable aluminum chloride vapor byproducts of an aluminum etch reaction can be removed quickly and easily from such etching systems and safely discarded without having to clean solid aluminum chloride deposits from deposition surfaces in the trap.

A more specific object of the invention is to provide a trap for removal of condensable aluminum chloride vapor from an etching effluent, wherein the trap comprises a disposable element for cooling, condensing, and retaining the condensable aluminum chloride vapor, and wherein the disposable element is easy to remove from the trap with minimal down time and labor and wherein the disposable element is inexpensive to replace.

Another specific object of the invention is to provide a trap having a disposable element for trapping and collecting condensable aluminum chloride vapor, wherein the disposable element prevents deposition of condensed aluminum chloride solids on the inner walls of the trap.

It is also an object of this invention to provide an improved method and apparatus for removing condensable aluminum chloride vapor from the exhaust line downstream of the vacuum pump and/or from the foreline upstream of the vacuum pump.

It is a further object of the present invention to decrease time, labor, and costs required to deal with removal of aluminum chloride downstream from a reaction chamber in semiconductor processing systems.

It is a further object of the present invention to provide a trap for an aluminum etching apparatus wherein condensable aluminum chloride vapor byproducts of an aluminum etch reaction can be quickly and easily removed from such etching systems and subsequently disposed of, thus reducing or eliminating the need to remove build-up of condensed aluminum chloride solids from the interior of a vacuum conduit system of the aluminum etching system, thereby reducing or eliminating exposure of humans to hazardous and toxic hydrogen chloride (HCl) fumes.

Additional objects, advantages, and novel features of the invention shall be set forth in part in the description that follows, and in part will become apparent to those skilled in the art upon examination of the following or may be learned by the practice of the invention. The objects and the advantages may be realized and attained by means of the instrumentalities and in combinations particularly pointed out in the appended claims.

To achieve the foregoing and other objects and in accordance with the purposes of the present invention, as embodied and broadly described herein, the method of the present invention may comprise condensing, solidifying, and retaining condensable aluminum chloride vapor from a reaction chamber effluent onto trapping media in an aluminum chloride trap. The apparatus for achieving the foregoing and other objects in accordance with this invention may comprise a trap having a disposable, replaceable trapping element contained within a chamber, wherein the disposable element comprises trapping media for condensing and trapping condensable aluminum chloride vapor as condensed aluminum chloride solids. The trap is designed such that the disposable element containing the condensed and deposited solid aluminum chloride can be easily removed from the trap for rapid and safe disposal of the aluminum chloride solids and subsequently replaced with a new disposable element. The disposable element efficiently traps condensable aluminum chloride vapor such that condensable aluminum chloride vapor is prevented from depositing as condensed aluminum chloride solids and building up on the interior walls of a vacuum conduit system (e.g., the vacuum forelines and exhaust lines) of the aluminum etching system or on the interior walls of the trap chamber, thus eliminating the hazardous conditions associated with cleaning the disposable element and the trap to remove condensed aluminum chloride solids from the interior surfaces of the vacuum conduit system (i.e., the forelines and exhaust lines) of the etching system and/or from the interior surfaces of the trap.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention. In the Drawings.

DETAILED DESCRIPTION OF THE PREFERRED EMBODIMENTS

Figure 1:
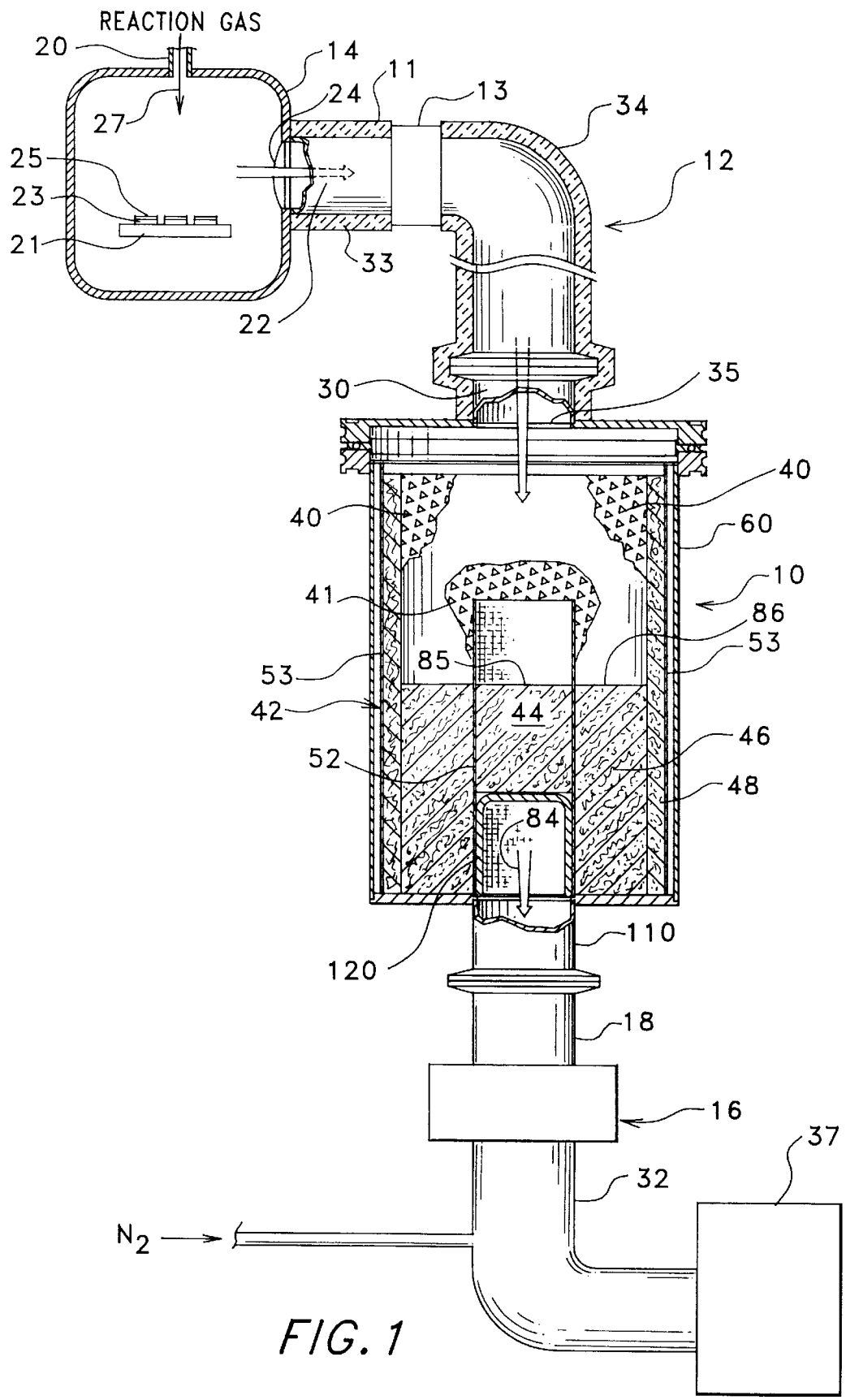
FIG. 1 is a representative diagrammatic view of a typical aluminum etching system with a trap of the present invention positioned in a foreline downstream of the reaction chamber and between the turbo pump and the vacuum pump, with the trap and part of the foreline shown in cross-section.

An aluminum chloride trap 10 according to the present invention is shown diagrammatically in FIG. 1 in a preferred mounting placement for use in trapping the aluminum chloride byproduct of an aluminum etching process in which aluminum is etched from exposed surfaces of an aluminum film 23 in a reaction furnace or chamber 14 by exposure to a chlorinated reaction gas in chamber 14 with the assistance of an rf plasma. In such etching systems, a turbo pump 13 is connected to a foreline 11 and is used to evacuate etching chamber 14 to a low pressure and to maintain such vacuum in etching chamber 14 in a range typically of about 5 to 100 mtorr, often about 10 mtorr, throughout the aluminum etching process. In the etching process for producing, for example, a semiconductor device, a substrate 21 having a film of aluminum 23 deposited on its surface is positioned in the chamber 14. A mask 25 (also referred to as a photoresist) is formed on the aluminum film 23 in a desired pattern by methods known in the art. A chlorinated reaction (i.e., etching) gas, such as chlorine ($Cl_2$) or boron trichloride ($BCl_3$), is then introduced through feed gas inlet 20, as indicated by flow arrow 27, into the approximately 100 mtorr vacuum etching chamber 14. An rf voltage field is applied to chamber 14 to create a plasma, which assists in the reaction (i.e., etching) of exposed aluminum film 23 with the chlorinated reaction gas. This plasma-assisted etching reaction between the exposed aluminum film 23 and the chlorinated reaction gas produces condensable aluminum chloride vapor ($AlCl_3$) byproducts and can be illustrated by the following equation:

$$2Al + 3Cl_2 \rightarrow 2AlCl_3 \tag{1}$$

where Al is the aluminum film 23, $Cl_2$ is the chlorinated reaction gas, and $AlCl_3$ is the condensable aluminum chloride vapor byproduct. The condensable aluminum chloride vapor exits the reaction chamber 14 along with excess chlorinated reaction gas through chamber outlet 24, as indicated by flow arrow 22. Vacuum pump 16 then pumps the chamber effluent (i.e., the condensable aluminum chloride vapor and excess chlorinated reaction gas) through forelines 11 and 12 and then through trap 10, where the condensable aluminum chloride vapor is condensed, solidified and trapped on disposable element 42, while the remaining effluent comprising the excess chlorinated reaction gas is directed out of trap 10, as indicated by flow arrow 84, and along exhaust lines 18 and 32 to scrubber 37, where the effluent containing the excess chlorinated reaction gas is treated for safe disposal.

Since turbo pump 13 must operate continuously to maintain the vacuum in chamber 14 as new reaction gas flows into the feed gas inlet 20, substantial amounts of the condensable aluminum chloride vapor byproducts created in the etching reaction are drawn out of the etching chamber 14, as indicated by flow arrow 22, and into vacuum conduit foreline segments 11 and 12 and vacuum conduit exhaust line segments 18 and 32 of the vacuum system. The condensable aluminum chloride vapor begins to decrease in temperature immediately after exiting the 150–200° C. etching chamber 14 and upon contact with cooler components of the vacuum conduit system (e.g., forelines segments 11 and 12 and exhaust line segments 18 and 32). Thus, if the vacuum conduit system forelines segments 11 and 12 and/or exhaust line segments 18 and 32 downstream of chamber 14 are not sufficiently heated, or if the condensable aluminum chloride vapor is not sufficiently trapped, the condensable aluminum chloride vapor will cool on contact with the cooler interior surfaces downstream of the chamber 14, causing the condensable aluminum chloride vapor to condense and deposit solid aluminum chloride along the inside surfaces of the foreline segments 11 and 12 and exhaust line segments 18 and 32. The position of trap 10 of this invention in an etching system will determine the number of heaters 33 and 34, such as heating jackets or heating tape, needed to heat foreline segments 11 and 12 and/or exhaust line segments 18 and 32 to prevent deposition of solid aluminum chloride in a vacuum conduit system of an aluminum etch system. Therefore, trap 10 is preferably, but not necessarily, positioned as close as practical to chamber 14 to minimize the number of heaters 33 needed, such as between turbo pump 13 and vacuum pump 16 as shown in FIG. 1. Trap 10 cools, condenses, solidifies, and traps the condensable aluminum chloride vapor byproducts created in reaction chamber 14, as indicated at 40 and 41, thus preventing condensable aluminum chloride vapor from cooling, condensing, solidifying and building up in vacuum pump 16 and in vacuum conduit exhaust line segments 18 and 32.

To prevent the condensable aluminum chloride vapor from condensing in and clogging the foreline segments 11 and 12 when trap 10 is positioned between turbo pump 13 and vacuum pump 16, as shown in FIG. 1, heaters, such as heating jackets 33 and 34, are usually placed around the piping foreline segments 11 and 12, respectively, to keep the temperature in the foreline segments 11, 12 elevated, preferably at a temperature above 70° C., to prevent the condensable aluminum chloride vapor in the effluent from cooling, condensing, solidifying, and accumulating before the effluent containing the condensable aluminum chloride vapor reaches the trap 10. Such condensation and solidification can also occur in valves and other piping components (not shown) upstream of trap 10, so it is not unusual to also keep such components heated as well. Through the use of heater 34, it is possible to control the temperature of the effluent as it enters trap 10, and, since the heater 34 may be positioned such that it abuts the inlet pipe 30 of trap 10, the heater 34 can also be used to help control the temperature of the inlet pipe 30 of trap 10 to prevent accumulation of the solid aluminum chloride on the inside walls of inlet pipe 30.

As a result of the placement of trap 10 in the preferred embodiment shown in FIG. 1, condensable aluminum chloride vapor is efficiently and completely trapped, so there is no need to heat outlet pipe 110 or exhaust line segment 18 leading from trap 10 to vacuum pump 16 or exhaust line 32 leading from vacuum pump 16 to the scrubber 37. In an industrial setup employing the embodiment illustrated in FIG. 1, the number of heaters which would be required upstream of trap 10 is relatively small compared to the number of heaters that would be necessary to heat an entire vacuum conduit system in a situation where trap 10 was not employed in an etching system. Consequently, trap 10 significantly reduces the cost associated with heating long sections of a vacuum conduit system in an etching system, which is required in conventional etching systems.

As discussed above, trap 10 of the present invention, when positioned as illustrated in FIG. 1, is designed to prevent build-up of condensed aluminum chloride solids in vacuum pump 16 and in exaust lines 18, 32, as well as in pressure gauges, valves, and other components downstream of trap 10. Briefly, trap 10 comprises a disposable element 42 contained within a housing 60, wherein disposable element 42 contains trapping media (discussed below in detail), that create ideal conditions for condensing condensable aluminum chloride vapor as solid aluminum chloride and condensing and trapping the condensable aluminum chloride vapor in disposable element 42 of trap 10, thereby removing the condensable aluminum chloride vapor from the chamber effluent before the condensable aluminum chloride vapor can cause problems farther downstream. The remainder of the effluent that exits trap 10 will be substantially free of condensable aluminum chloride vapor, and thus will comprise primarily excess chlorinated reaction gas, which passes through the vacuum pump 16 and exhaust line segments 18, 32 harmlessly and without build-up of solid aluminum chloride, and then continues on to the scrubber 37 for safe treatment and disposal of such excess chlorinated reaction gas. Disposable element 42 of trap 10 is further designed so that it may be removed easily and quickly from trap after an appropriate period of time, allowing for safe and rapid disposal of the solid aluminum chloride buildup collected within disposable element 42, and subsequently replaced with a new disposable element.

Referring now to FIGS. 2–6, the preferred embodiment of the aluminum chloride trap 10 according to this invention has a metal housing 60, an upstream end wall 94 and a downstream end wall 108. The upstream end wall 94 has an inlet opening 35, and the downstream end wall has an outlet opening 114. One of the end walls 94, 108, preferably, but not necessarily, the upstream end wall 94, is removable and fastenable in place, such as with clamp 104 on flanges 98, 100. The upstream end wall 94 has a pipe-fitting 96, and the downstream end wall 108 has a pipe-fitting 112 for the removably fastening the trap 10 in the forelines 12, 18 of the system illustrated in FIG. 1.

Figure 2:
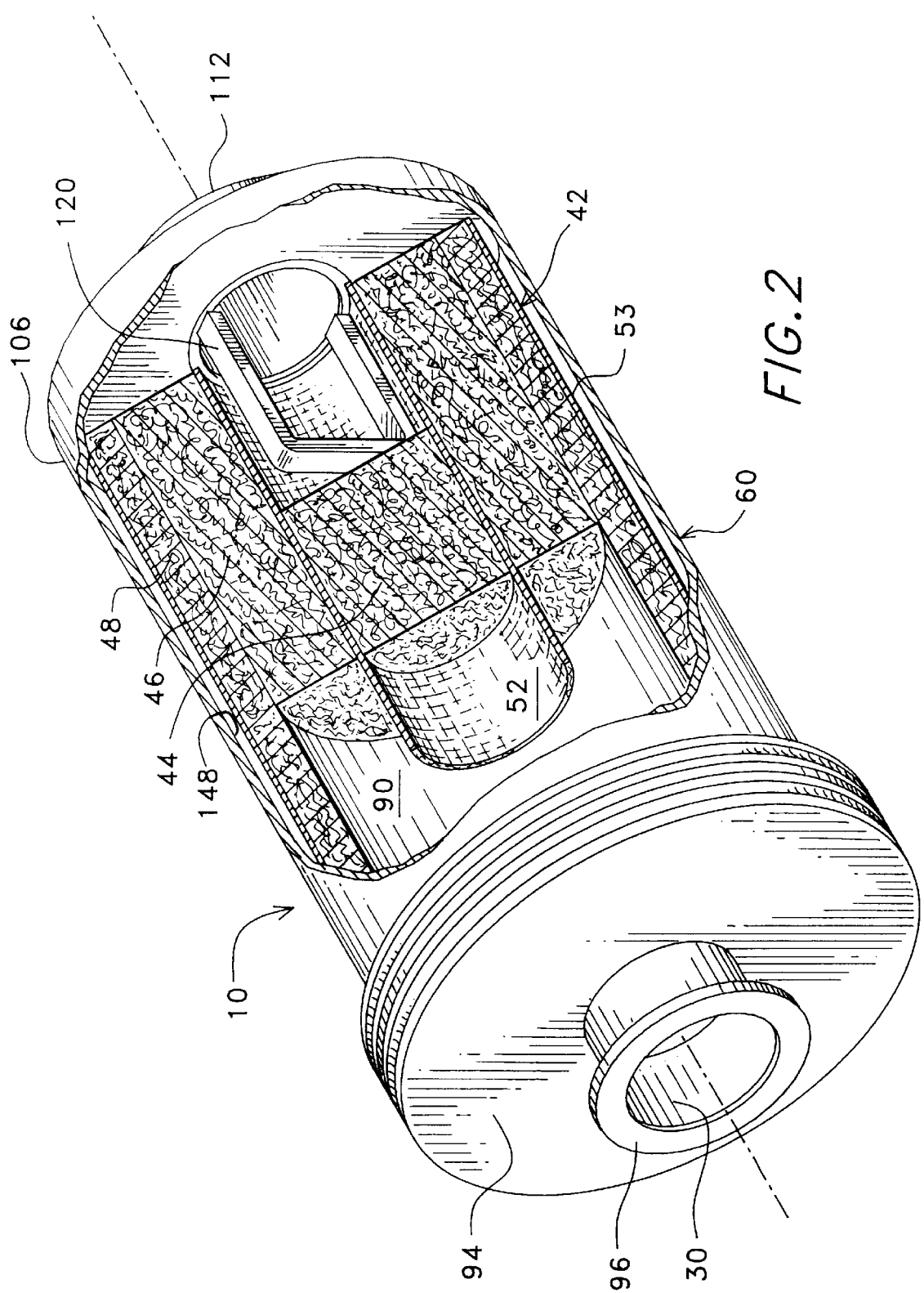
FIG. 2 is an isometric view of the trap of the present invention with a portion of the housing cut away to reveal the trapping media, and with a portion of the trapping media cut away to reveal the inner core and guide.
Figure 3:
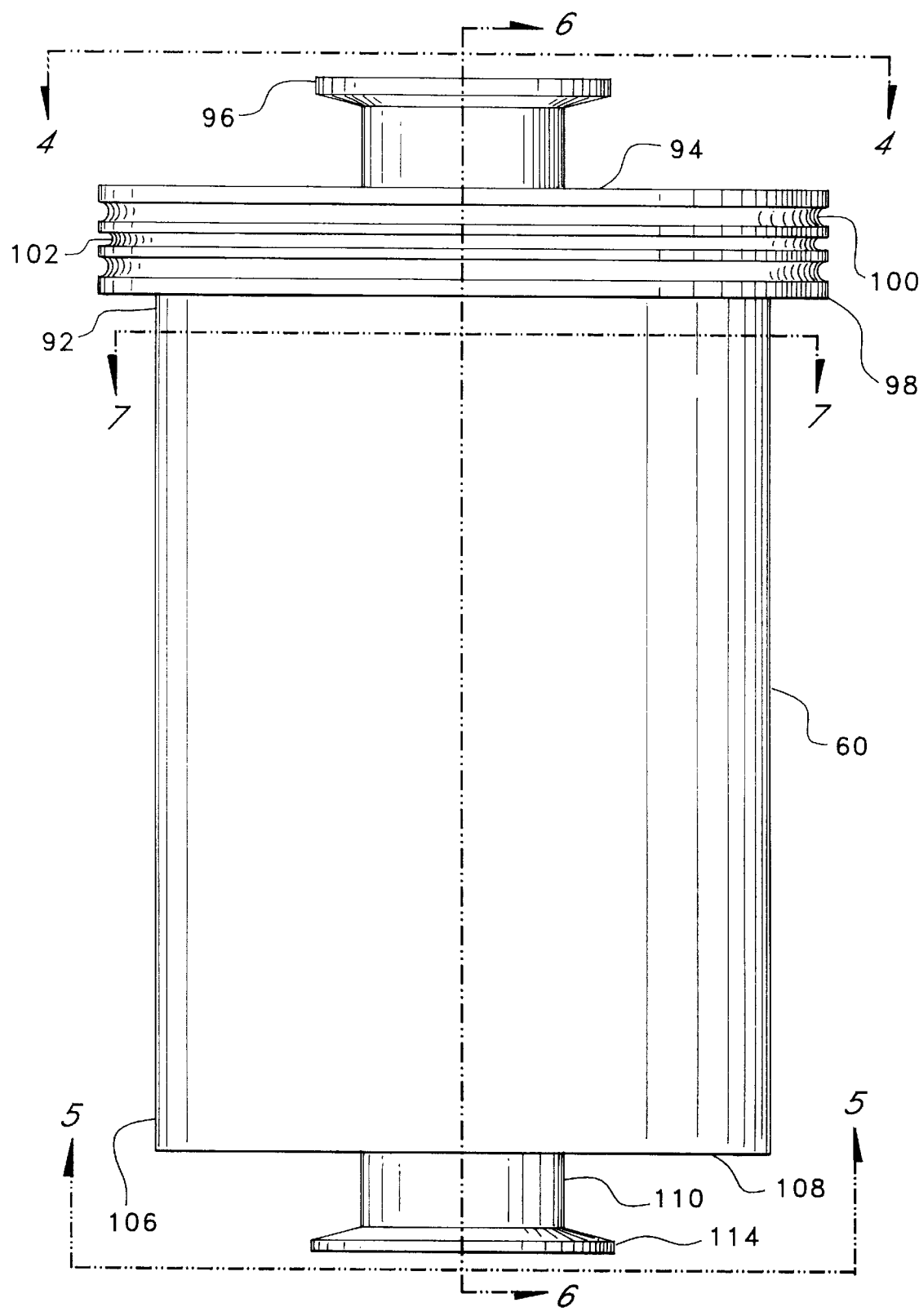
FIG. 3 is an elevation view of the trap shown in FIGS. 1 and 2.
Figure 4:
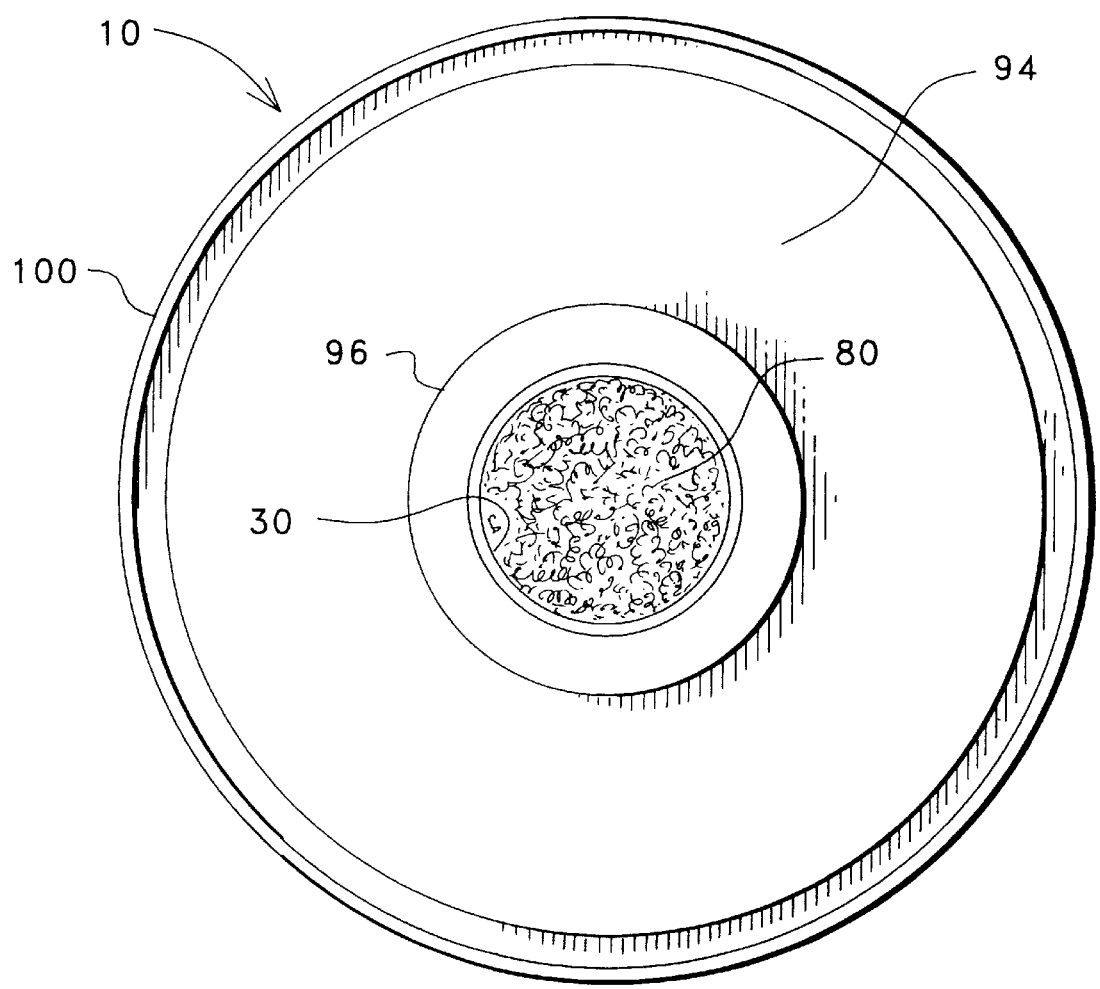
FIG. 4 is a top plan view of the trap shown in FIGS. 1 and 2, as indicated by line 4—4 in FIG. 3.
Figure 5:
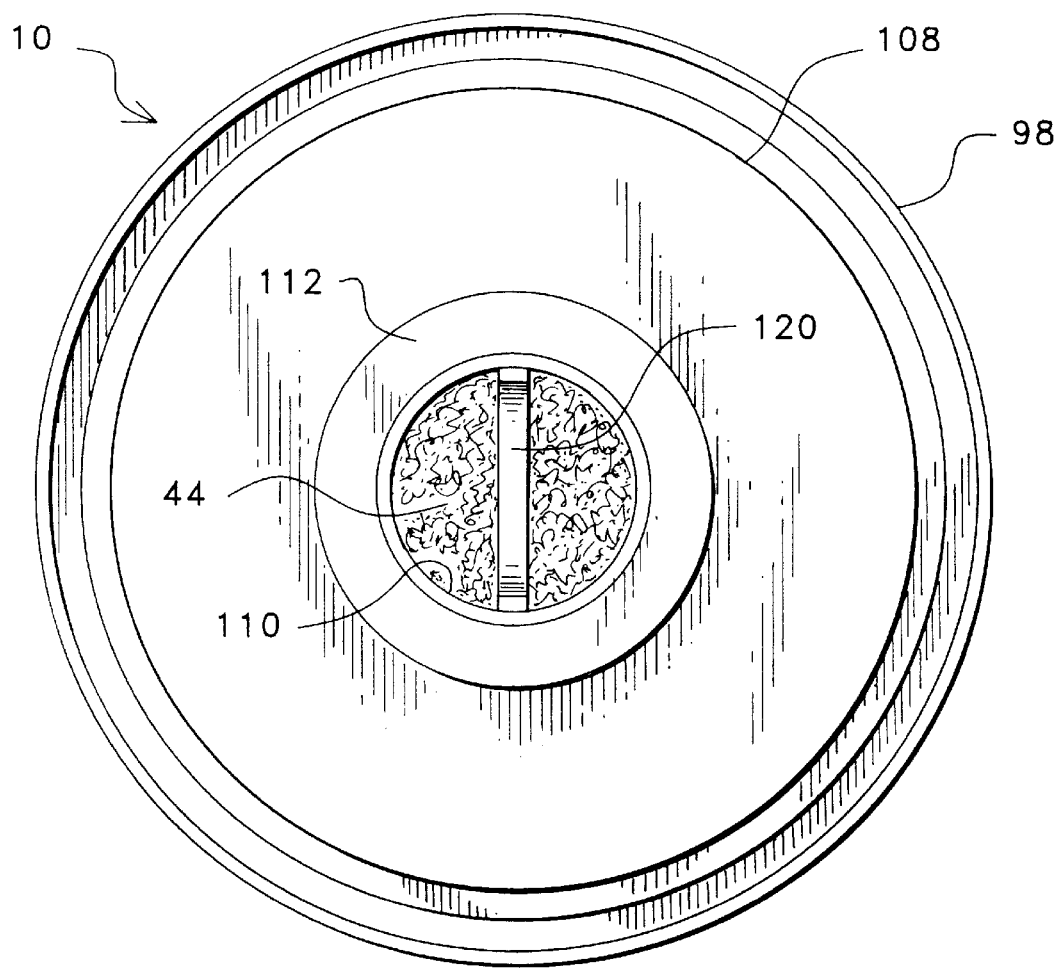
FIG. 5 is a bottom plan view of the trap shown in FIGS. 1 and 2, as indicated by line 5—5 in FIG. 3.
Figure 6:
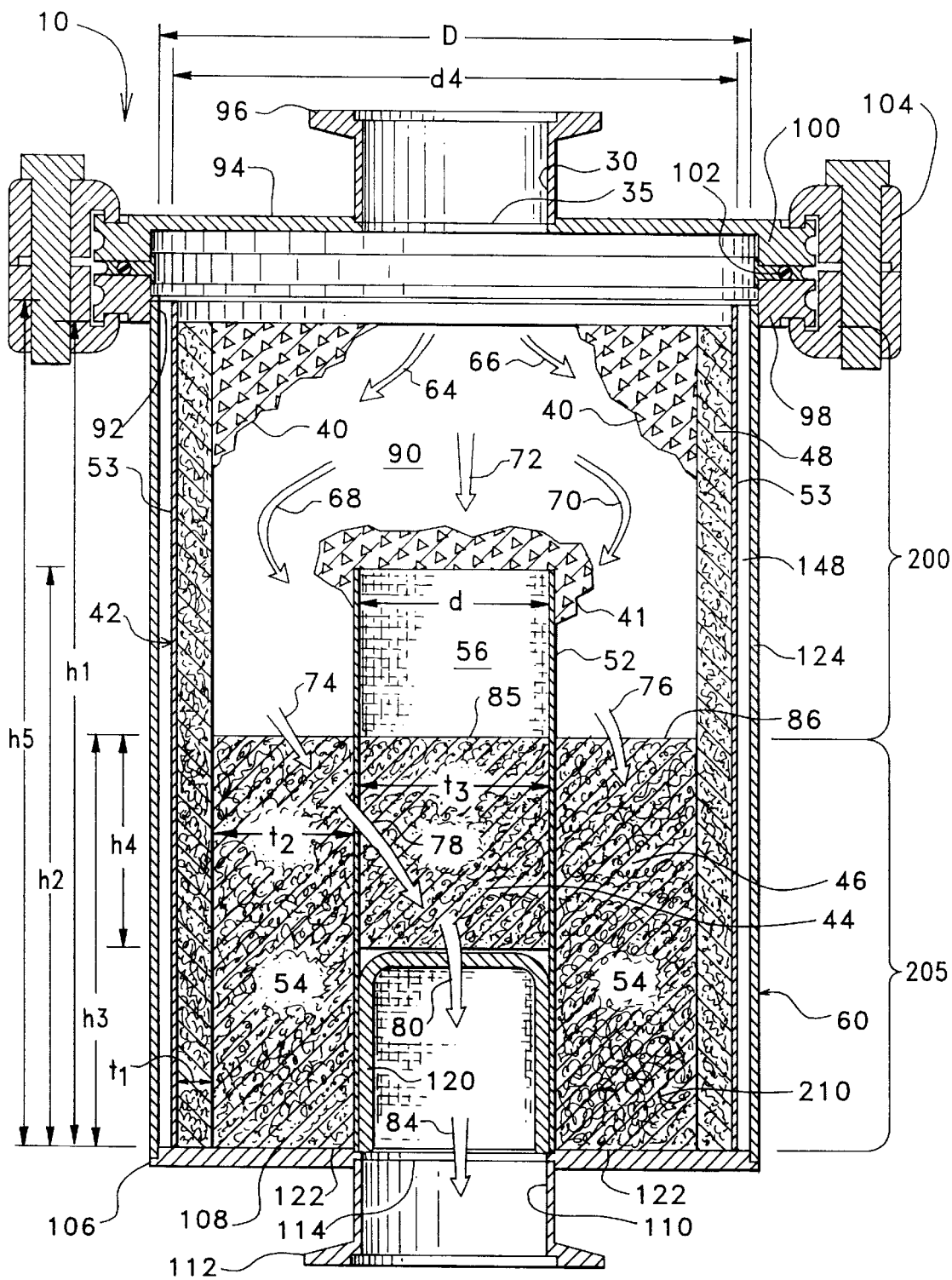
FIG. 6 is a longitudinal cross-sectional view of the trap of the present invention take along section line 6—6 of FIG. 3.
Figure 7:
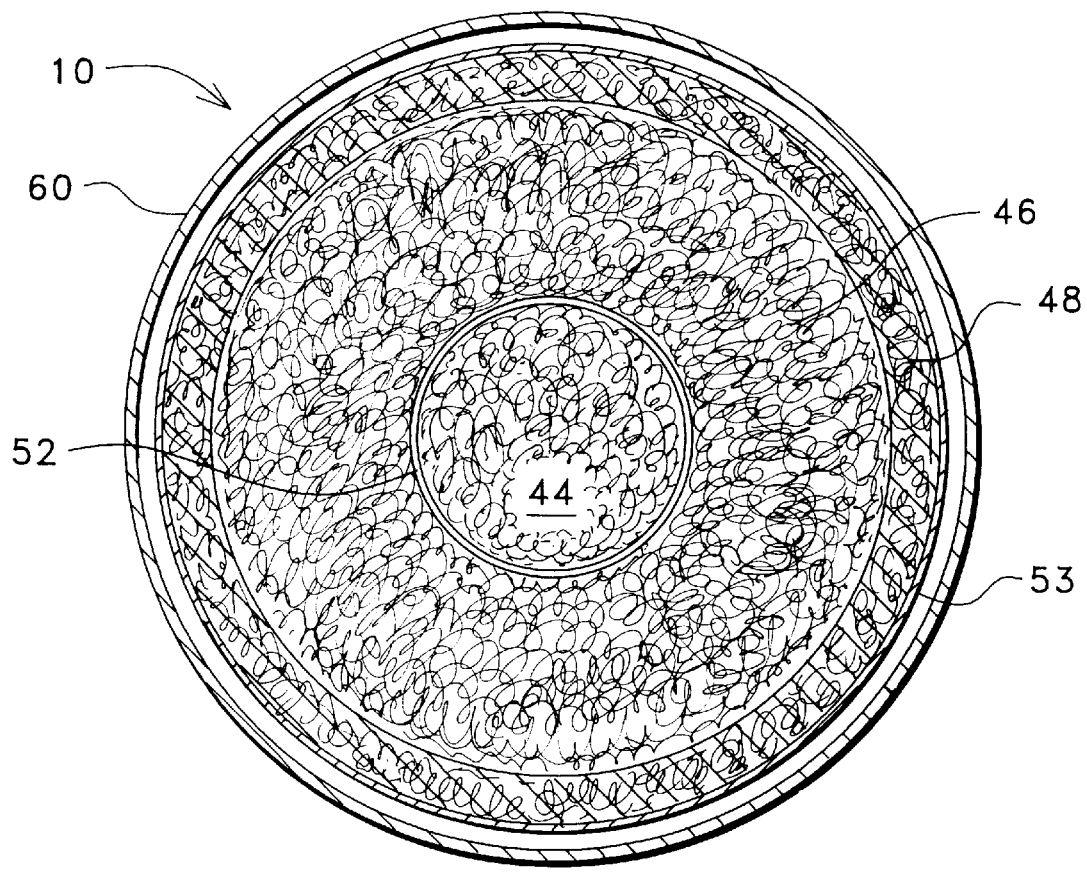
FIG. 7 is a transverse cross-sectional view of the trap shown in FIGS. 2 and 3, taken along section line 7—7 of FIG. 3.

As shown in FIGS. 2 and 6, the housing 60 and end walls 94, 108 of trap 10 enclose an interior chamber 90, and a removable, disposable trap element 42 is positioned in the chamber 90 for condensing and trapping the aluminum chloride in the effluent from the reaction chamber 14 of FIG. 1. The trap element 42 comprises a cylindrical outer trapping medium 48 surrounded by a solid, cylindrical shield 53, a smaller diameter cylindrical screen column 52 inside the outer trap medium 48, a core trapping medium 44 disposed in the cylindrical screen column 52, and an annular intermediate trapping medium 46 disposed in the annular space 54 between the screen column 52 and the outer medium 48. The trapping media 44, 46, 48 comprise mesh material, preferably metal mesh, that allows flow of gases therethrough, but that also provides many surfaces that facilitate condensation and deposition of aluminum chloride 40, 41 in FIG. 6. The outer cylindrical medium 48 and the cylindrical screen column 52, especially those portions of outer medium 48 and screen column 52 that are upstream of core medium 44 and annular medium 46, comprise a primary or first trapping stage 200 of the removable, disposable trapping element 42, and the core medium 44 and annular medium 46 comprise a secondary or second trapping stage 205 of the disposable trapping element 42.

Essentially, the aluminum chloride component of the gaseous effluent flowing into chamber 90, as illustrated by flow arrows 64,66, in FIG. 6, condenses and deposits first on the upper portions of outer trapping medium 48, as illustrated by solid aluminum chloride build-up 40, and on the upper end of inner screen column 52, as illustrated by solid aluminum chloride build-up 41. Most of the aluminum chloride gas in the effluent (approximately 90 to 95 percent or more) condenses and deposits in this primary or first trapping stage 200. The rest of the aluminum chloride in the effluent (approximately 5 to 10 percent or less) that does not condense and deposit in this primary or first trapping stage will condense and deposit in the core medium 44 and annular medium 46 of the secondary or second trapping stage 205. The outer shield 53 prevents any gaseous aluminum chloride from passing through the outer medium 48 and condensing and depositing on the inside surface of the housing 60 of the trap 10.

When the solid aluminum chloride build-up 40, 41 in the first trapping stage 200 and/or solid aluminum chloride build-up in the core medium 44 and annular medium 46 of the second trapping stage 205 accumulate enough to inhibit effluent flow into or through the trap 10, the trapping element 42 with the aluminum chloride build-up 40, 41 can be removed as a unit from chamber 90 and replaced with a new trapping element 42. The removable end wall 94 facilitates such removal and replacement of the trapping element 42.

Typically, an aluminum etch system employing trap 10 of this invention may be operated continuously for about 6 to 12 months before it is necessary to replace the disposable trapping element 42. Such capacity and longevity of trap 10 of this invention, combined with the relatively inexpensive materials used to construct the replaceable, disposable trapping element 42, as will be described in more detail below, makes trap 10 far more inexpensive and practical than any aluminum chloride trap previously used in the art.

Trap 10, according to the present invention and as illustrated in a preferred embodiment in FIGS. 1 and 2, is designed to efficiently and thoroughly condense condensable aluminum chloride vapor produced in an aluminum etching system onto disposable element 42 of trap 10 and to retain the condensed aluminum chloride solids in disposable element 42. Such trapping and easy disposal of aluminum chloride is achieved by the novel design of disposable element 42, which is positioned in chamber 90 of trap 10 between inlet pipe 30 and outlet pipe 110.

Disposable element 42 comprises aluminum chloride trapping media 44, 46, 48 (described in more detail below), which provide large surface areas for the efficient condensation and trapping of condensable aluminum chloride vapor that builds up as condensed aluminum chloride solids on the surfaces of the trapping media as illustrated by build-up 40 and 41 in FIG. 1, while allowing other molecules, such as chlorinated reaction gases in the effluent, to pass unimpeded through the disposable element 42. In order to cause the condensable aluminum chloride vapor to condense on the components of disposable element 42, disposable element 42 must lower the temperature of the condensable aluminum chloride vapor. Disposable element 42 comprises trapping media 44, 46, 48 (discussed below in detail) which act as heat exchangers where heat is transferred from the condensable aluminum chloride vapor in the effluent to the trapping media. A significant feature of disposable element 42 of trap 10 is that the physical geometries and properties of the trapping media 44, 46, 48 in disposable element 42 can be optimized to maximize the cooling, condensation, and solidification of condensable aluminum chloride vapor within disposable element 42 without the need for any external or internal cooling mechanism. Since the amount of heat exchanged between the molecules of the condensable aluminum chloride vapor and the trapping media of disposable element 42 is largely dependent on the physical impact or collision of the vapor molecules onto the ambient temperature interior surfaces of the trapping media, 44, 46, 48 the surface areas of the trapping media 44, 46, 48 of disposable element 42 are optimized to create sufficient heat exchange surfaces, without impeding effluent flow though trap 10 (discussed below).

To maximize the condensation, deposition, and trapping of condensable aluminum chloride vapor, disposable element 42 according to this invention preferably has a combination of features. First, the trapping media 44, 46, 48 of disposable element 42 will preferably have sufficient surface areas for condensing and trapping condensable aluminum chloride vapor. Second, while providing the many surface areas for condensation and deposition of the condensable aluminum chloride vapor, the trapping media 44, 46, 48 of disposable element 42 should nevertheless have high flow conductance for chlorinated etching gas molecules in the effluent so as not to inhibit the ability of the vacuum pump to remove the chamber effluent from etching chamber 14. Third, the trapping media of disposable element 42 should also have a large collection capacity to hold substantial volumes of condensed aluminum chloride solids build-up 40 without clogging the trap 10. Fourth, there should be sufficient distance between trap inlet opening 35 and the upper surfaces of the trapping media 44, 46, 48 so that solid aluminum chloride buildup 40 and 41 will not clog inlet opening 35 after only a short period of time. Finally, disposable element 42 should be easy to remove for safe and rapid disposal of the deposited aluminum chloride solids.

A preferred, albeit not the only, embodiment of trap 10 of this invention will now be described in detail. Trap 10, as stated broadly, is a structure that contains disposable element 42 within a housing and between an inlet and an outlet, and wherein disposable element 42 has sufficient transverse thickness and sufficient density of surfaces to condense and trap substantially all of the aluminum chloride gas molecules on the surfaces. Preferably, trap 10 has a substantially cylindrical structure. However, trap 10 may comprise many other shapes and structures that can also be used according to the principles of this invention.

Referring now to FIGS. 2–7, the preferred embodiment for trap 10 of this invention has an elongated, substantially cylindrical housing 60 having an inner diameter D in the form of a canister that encloses a trap chamber 90. The inlet end 92 of the housing is enclosed by a removable inlet fitting 94 with an inlet opening 35 and a suitable flange 96 adapted for connection to a pipe fitting in the pump line 12 (FIG. 1). With continuing reference to FIGS. 2–7, a suitable flange 98 is affixed to the inlet end 92 of the housing 60 to mate and seal with a similar flange 100 on the inlet fitting 94. A gasket 102 can be positioned between the mating flanges 98, 100 to assist in providing a vacuum-tight seal. Suitable clamps 104 or any other suitable fastener can be used to squeeze and retain the two flanges 98, 100 together, as is common and well-known to persons skilled in the art. The outlet end 106 of housing 60, as shown in FIGS. 2–5, is enclosed by an end wall 108 with an outlet opening 114 that terminates with a suitable pipe fitting flange 112 connected to outlet pipe 110.

With continued reference to FIGS. 2–7, the preferred, but certainly not necessary, structure of the disposable element 42 (described in detail below) is cylindrical with a height $h_5$, outer diameter $d_4$, and inner core diameter d (FIG. 6). Guide 120 for mounting disposable element 42 in housing 60 is affixed to end wall 108 and has a width that is approximately equal to, or slightly smaller than, the inner core 56 diameter d of disposable element 42. The lower end 122 of disposable element 42 slips around guide 120, which centers and retains the disposable element 42 within the housing 60, and abuts the end wall 108. Therefore, the disposable element 42 is centered and held in place by guide 120. Guide 120 is preferably a U-shaped strap, as best seen in FIGS. 2 and 6 or may be any other structure provided that it does not occlude the outlet opening 114 of trap 10. As previously discussed, a heating jacket 34 or heating tape can be used to heat inlet pipe 30 (FIG. 1) to control the temperature of the effluent from reaction chamber 14 as the effluent enters trap 10 at inlet pipe 30, and since the heater 34 abuts inlet pipe 30, the heater 334 can also be used to help control the temperature of inlet pipe 30.

For purposes of explanation, but not limitation, of the structure of trap 10 of the present invention, housing 60 can have an outer diameter of approximately 6 inches, an inner diameter D of approximately 5.75 inches (FIG. 6), and a height $h_5$ of approximately 8.5 inches.

To remove disposable element 42 from housing 60, such as when disposable element 42 is clogged with condensed aluminum chloride solids, trap 10 is first removed from the pump lines 12 and 18 (see FIG. 1). Then, the clamps 104 are removed so the inlet fitting 94 can be removed from the inlet end 92 of the housing 60 (see FIG. 6), and disposable element 42 can be slid off the guide 120 and removed from the trap chamber 90 of housing 60. A new disposable element 42 can be installed by reversing this procedure.

It goes without saying that the terms "upper" and "lower" or "top" and "bottom" as used in this description are for convenience only. The "upper" and "lower" or "top" and "bottom" are in reference to the vertical orientation of trap 10 illustrated in FIGS. 1 and 3. Obviously, trap 10 can also be used in other mounting positions, such as horizontal, upside down, or any position in between, without changing the substance of this invention. Also, housing 60 and trapping media shapes other than cylindrical can be used according to this invention. Further, there are many other structures for opening the trap 10 to facilitate removal and replacement of the disposable element 42 within the scope of this invention, such as an openable housing 60, a threaded end wall 94 or 108, and many others, as will be apparent to persons skilled in the art once they understand the principles of this invention.

Figure 8:
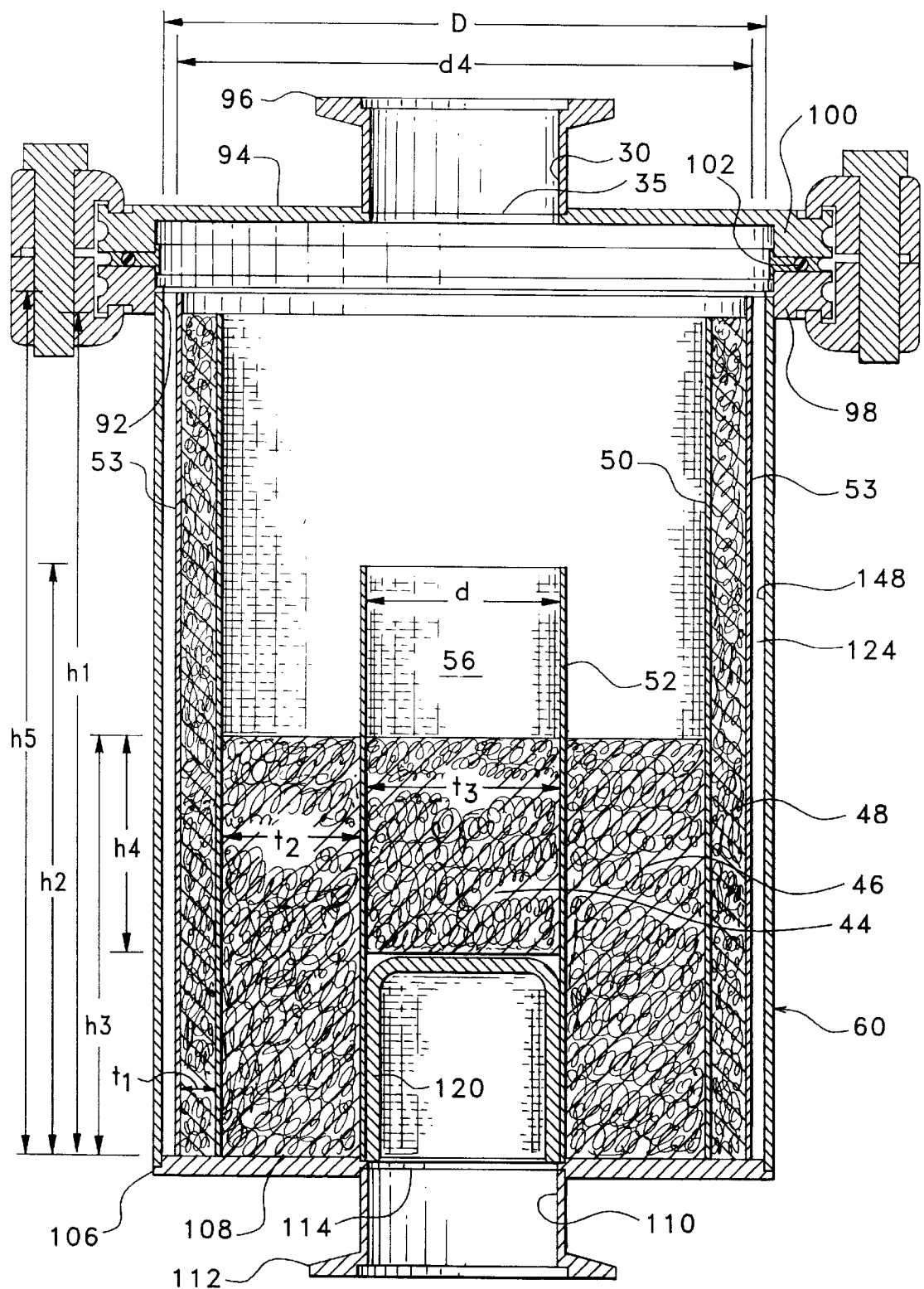
FIG. 8 is a longitudinal cross-sectional view similar to FIG. 6, but of an alternative embodiment of the trap of the present invention wherein the disposable element includes an outer core.
Figure 9:
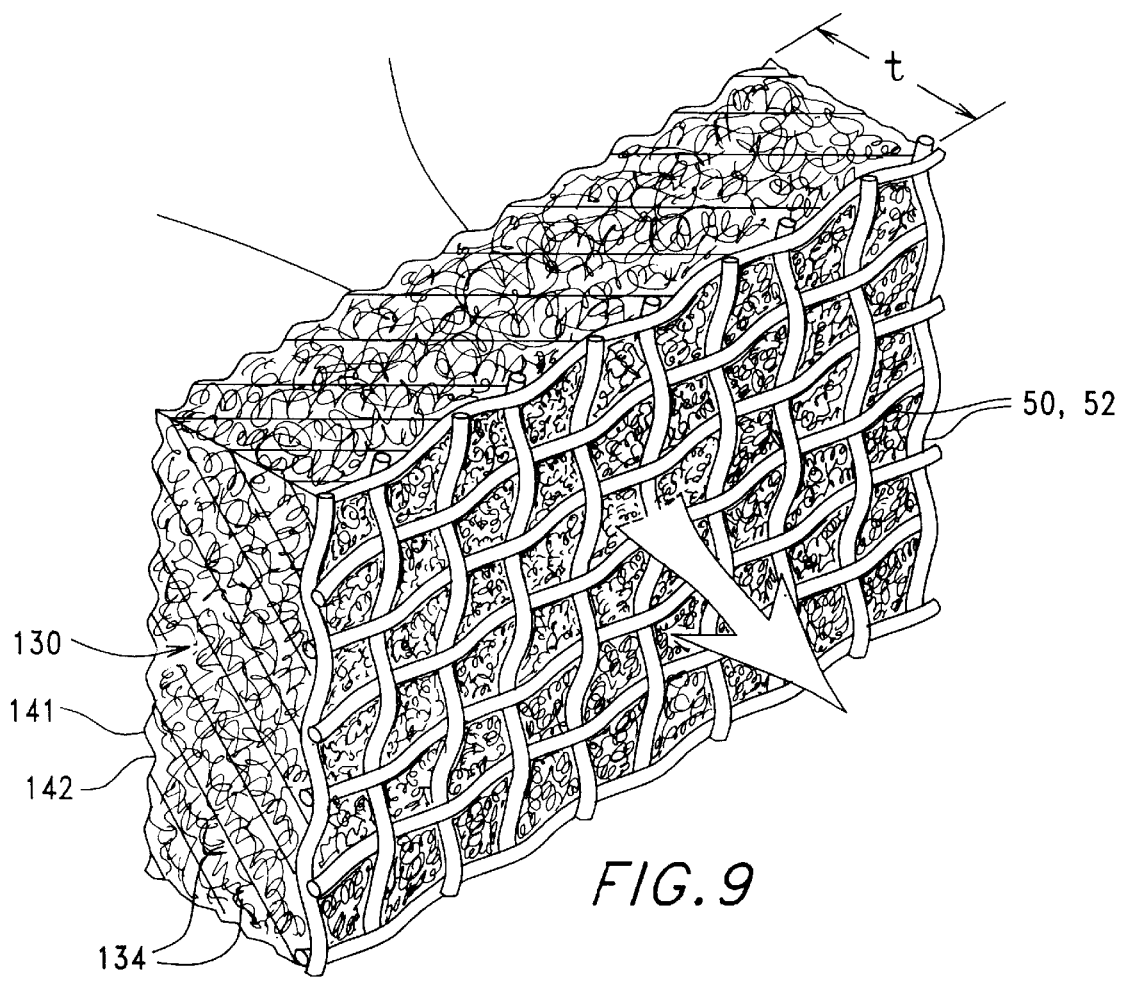
FIG. 9 is an isometric view of a section of a preferred trapping medium according to the present invention.

Disposable element 42 of trap 10 will now be described in detail. Referring now primarily to FIG. 6, but also with supplemental reference to FIGS. 2–5 and 7 disposable element 42 comprises outer trapping medium 48 of height $h_1$ and transverse thickness $t_1$ and which preferably is a substantially cylindrical structure, and inner screen column 52, also preferably a cylindrical hollow structure and having a height $h_2$, contained within outer trapping medium 48 and in spaced relation to outer trapping medium 48 such that an annular space 54 is defined between outer trapping medium 48 and inner screen column 52. Disposed within annular space 54 is intermediate trapping medium 46 having a transverse thickness $t_2$ and height $h_3$. Inner cylindrical screen column 52 further defines inner core 56 within which is disposed trapping medium 44 having transverse thickness $t_3$ and height $h_4$. A solid protective shield 53 having a height $h_5$ surrounds protective outer trapping medium 48. Optionally, an outer screen column 50, preferably cylindrical in shape, may be disposed between trapping media 46 and 48, as shown in FIG. 8, to provide additional structural support to disposable element 42. Trapping media 44, 46, and 48 are made of metal (preferably stainless steel) mesh 130, as illustrated in FIG. 9, and provide the preferred surface structures and functions for disposable element 42 as described above. Such metal mesh 130 can be formed in a variety of ways with a variety of structures, including, but not limited to, stacked or compounded layers of metal fabric made, for example, with interlaced metal wire or thread 134, as illustrated in FIGS. 9–13 and 16, or with multiple layers of woven metal screens, or some other material with many tangled or ordered metal micro-surfaces 210, (FIG. 16) to create the required transverse thickness and surface area density through which the effluent from the reaction chamber 14 (FIG. 1) must pass to condense and trap all the aluminum chloride gas molecules.

Inner cylindrical screen column 52 serves not only as a trapping medium for condensing, solidifying, and trapping condensable aluminum chloride vapor, but also serves to anchor disposable element 42 within chamber 90 of trap 10. Therefore, inner cylindrical screen column 52 comprises a material that is somewhat stiffer than trapping media 44, 46, 48, and preferably comprises a wire screen such as a 4×4 to 8×8 mesh wire screen. The term "screen" as used throughout this invention is not limited to wire screens and includes other structures such as pierced or perforated materials. Further, inner column shapes other than cylindrical may be employed. As discussed above, outer cylindrical screen column 50 (FIG. 8) may optionally be incorporated into disposable element 42 for additional structural support. Optional outer cylindrical screen column 50 preferably comprises a wire screen such as a 4×4 to 8×8 mesh wire screen. Other materials, such as perforated or pierced metal, may also be utilized as outer screen column 50. Further, outer column shapes other than cylindrical may be employed.

Trapping media 44, 46, 48, inner cylindrical screen column 52, and solid shield 53 of disposable element 42 preferably all have sufficient heights and diameters to accommodate a large enough volume of condensed aluminum chloride solids, such that the etching chamber 14 can be operated for substantial periods of time before the disposable element 42 becomes clogged with build-up 40,41 to an extent that its capacity to condense and trap aluminum chloride gas molecules is diminished, or to an extent that conductance of the effluent gas through the vacuum conduit system is diminished. Such heights and diameters will, of course, depend on the amount of condensable aluminum chloride vapor in the effluent and the length of time it is desired to operate the etching chamber 14 before requiring service. Before the build-up of condensed aluminum chloride solids in disposable element 42 accumulates to such a volume that the condensed aluminum chloride solids diminish the capacity of disposable element 42 to condense and trap aluminum chloride gas molecules or to conduct non-condensed gas, the system can be shut down and the clogged or partially clogged disposable element 42 can be simply removed from the trap 10 and replaced with a new disposable element as discussed above.

The primary functions of trapping media 44, 46, 48 and of inner cylindrical screen column 52 and outer (gas-impervious) shield 53 are to provide large surface areas which are at approximately ambient temperatures, such that aluminum chloride gas molecules in the effluent can be efficiently cooled, condensed, deposited, and trapped in trap 10 without the need for additional internal or external active cooling of trap 10. A significant feature of trap 10 of this invention is that disposable element 42 can be designed in a manner that allows for the manipulation of the deposition profile of the condensed aluminum chloride solids in the disposable element 42, and thus enables an efficient method of condensing, solidifying, and trapping aluminum chloride vapor that is present in the etching effluent. The deposition profile may be manipulated by adjusting the heights and densities of trapping media 44, 46, 48 and of inner cylindrical screen column 52 and outer shield 53, as discussed in more detail below.

The condensation process of the aluminum chloride vapor in disposable element 42 is a phase change process. The condensable aluminum chloride vapor changes from the vapor or gaseous phase to the solid phase as the aluminum chloride vapor flows through disposable element 42. A condensable vapor or gas in a gas stream will condense when its partial pressure in the vapor phase is greater that the equilibrium vapor pressure. More specifically, the partial pressure of a gas comprising two or more different gaseous components (molecular species) is the cumulative total of the individual pressures of each such component in the gas. Therefore, for an effluent of an aluminum etching system, such as the effluent from the reaction chamber 14 (FIG. 1), comprising condensable aluminum chloride vapor ($AlCl_3$) and chlorine ($Cl_2$) reaction gas, each of the two components, aluminum chloride ($AlCl_3$) and chlorine ($Cl_2$), has its own partial pressure. The total pressure of the gas comprising the mixture of the two components, aluminum chloride ($AlCl_3$) and chlorine ($Cl_2$), is equal to the sum of the partial pressures of the two components aluminum chloride ($AlCl_3$) and chlorine ($Cl_2$). The equilibrium vapor pressure for aluminum chloride ($AlCl_3$) is the pressure at which the rate of condensation of the aluminum chloride ($AlCl_3$) from a vapor to a solid is equal to the rate of evaporation or vaporization of the aluminum chloride ($AlCl_3$) from a solid to a vapor.

Figure 15:
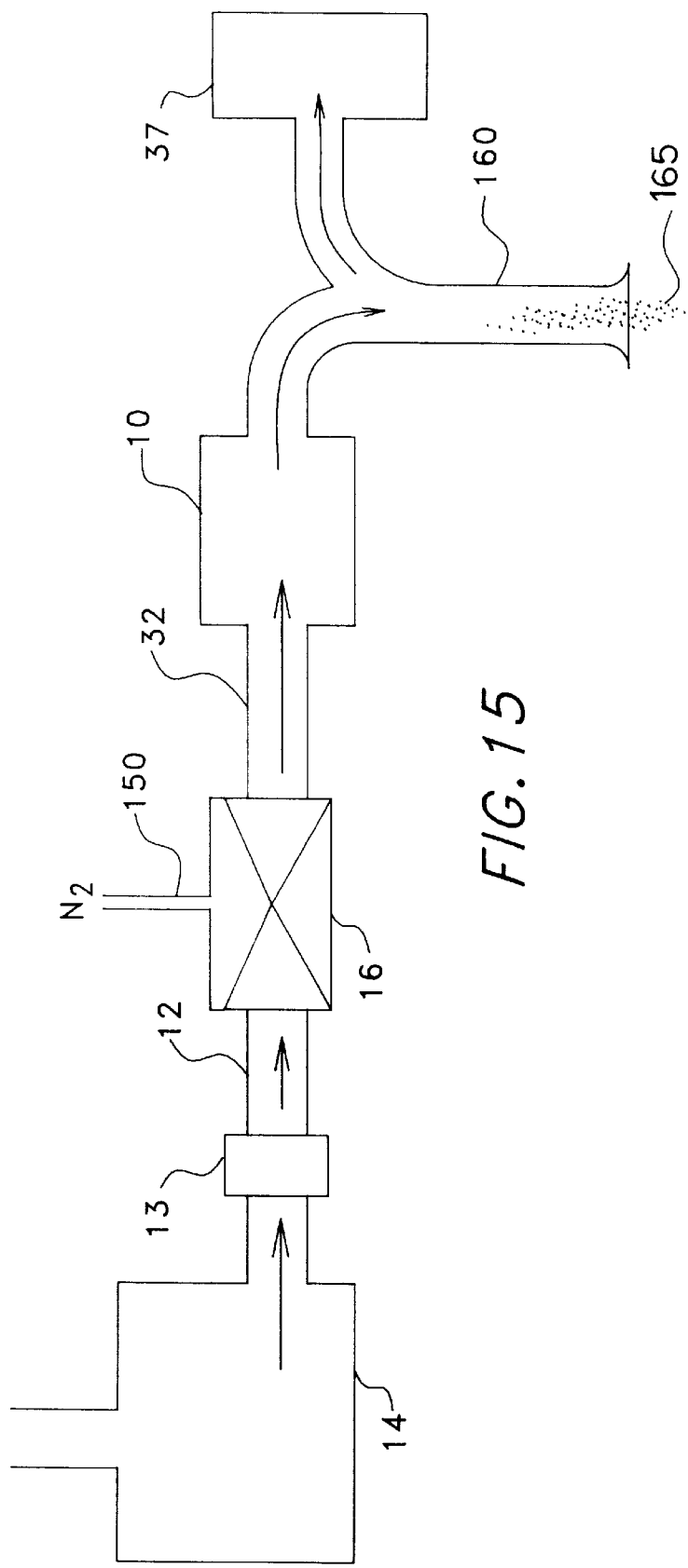
FIG. 15 is an alternative representative diagrammatic block view of a typical aluminum etching system showing a reaction chamber, a turbo pump, an aluminum chloride trap, a vacuum pump, vacuum system forelines and exhaust lines, and scrubber, wherein the trap is positioned between the vacuum pump and the scrubber.

The vapor pressure of a condensable vapor is related to the temperature of the condensable vapor, which can be expressed by the Antoine equation:

$$\ln p = A - B/T + C \qquad (2)$$

where A, B, and C are constants, p is the vapor pressure measured in Torr, and T is the temperature measured in degrees Celsius. For aluminum chloride ($AlCl_3$), A is approximately equal to 31.431, B is approximately equal to 950436, and C is approximately equal to 202.39. The vapor pressure curve for aluminum chloride is shown in FIG. 15. Continuing the example discussed above in relation to equation (1) and with reference to the vapor pressure curve shown in FIG. 15, if it is assumed that the temperature of the aluminum chloride vapor entering the trap 10 is 100° C. and the partial pressure of the aluminum chloride is 100 milliTorr, an initial temperature decrease of approximately 18° C. will result in a condensation of approximately 90% of the condensable aluminum chloride vapor in the effluent flowing through disposable element 42 of trap 10. A second temperature decrease of approximately 16° C. will result in a condensation of approximately ninety percent (90%) of the remaining ten percent (10%) aluminum chloride vapor in the effluent flowing through disposable element 42. Thus, as previously discussed above, controlling the physical profile of disposable element 42 (i.e., by adjusting the densities of the trapping media 44, 46, 48 of disposable element 42 and thus the amount of surface area 210 available) will significantly control the deposition profile of the trap 10. Therefore, in order to obtain a trap 10 that has a high trap capacity in a reasonable physical size, uses most of its available trap volume, and does not become prematurely clogged at the inlet opening 35 to the trap 10, the cooling of the condensable aluminum chloride vapor entering trap 10 through inlet opening 35 should be limited so that condensation of the condensable aluminum chloride vapor at these locations is minimized. In other words, the profile of the trapping media 44, 46, 48 of disposable element 42 of trap 10 should be such that the trap 10 does not clog prematurely at the inlet opening 35, as will be discussed in more detail below.

With reference now to FIG. 6, the deposition of aluminum chloride solids in disposable element 42 of trap 10 and the manipulation of the deposition profile will be discussed. In general, disposable element 42 of trap 10 may be considered as comprising at least two deposition stages or areas, first deposition stage 200 and second deposition stage 205, where deposition of solid aluminum chloride will occur. A majority (approximately 90 to 95 percent or more) of the condensable aluminum chloride vapor contained in the chamber effluent will be collected and trapped in trapping media, including the upper portion of the outer trapping medium 48 and the upper portion of the screen column 52, provided in the first or primary deposition stage 200 of disposable element 42. The above-described trapping media of the first deposition stage 200 will preferably be sufficiently spaced from the inlet opening 35 of trap 10 such that inlet opening 35 will not become clogged with condensed aluminum chloride solids after only a short period of use. The remaining (approximately 5% or less) of the condensable aluminum chloride vapor will be condensed and trapped in the second deposition stage 205 of disposable element 42, where denser and highly efficient trapping media are provided. The denser trapping media provided in the second deposition stage 205 of disposable element 42 contain significantly higher amounts of surface areas provided to maximize molecular contact with the remaining condensable aluminum chloride vapor molecules (approximately 5 to 10 percent or less) which were not trapped in the first deposition stage 200, and thus maximizing heat exchange, cooling, condensing, and trapping of the remaining (approximately 5 to 10 percent or less) condensable aluminum chloride vapor molecules.

With continued reference to FIG. 6, a portion of the aluminum chloride gas molecules in the effluent entering trap 10 through inlet opening 35 will impact outer trapping medium 48 (and optionally outer cylindrical screen column 50 if outer cylindrical screen column 50 is included in the disposable element, as shown in FIG. 8) as indicated by flow arrows 64 and 66 in FIG. 6. The impact of the aluminum chloride gas molecules creates a heat transfer between the aluminum chloride gas molecules and outer trapping medium 48, thus reducing the temperature of the aluminum chloride gas molecules, which in turn causes the molecules to condense and solidify on outer trapping medium 48, as indicated by the solid aluminum chloride buildup 40 in FIG. 6. Since the gas volume flow rate in aluminum etch systems is typically fairly low (approximately 100–200 sccm), and the mass flow rate is also relatively low (approximately 0.12 g/min), cooling of the aluminum chloride vapor by physical collision with outer trapping medium 48 is very efficient, and consequently an external or internal cooling mechanism is not necessary in trap 10 of the present invention. Therefore, as the aluminum chloride gas molecules come into contact with outer trapping medium 48, the temperature of the aluminum chloride gas molecules will decrease due to contact cooling, and therefore a large amount of aluminum chloride gas molecules will condense, solidify, and accumulate as solid aluminum chloride build-up 40 on outer trapping medium 48. In order to avoid early clogging of inlet opening 35, it is preferred that the upper surface of outer trapping medium 48 be of a sufficient distance from trap inlet opening 35 so that the initial aluminum chloride build-up 40 on outer trapping medium 48 will not clog inlet opening 35. Preferably height $h_1$ of outer trapping medium 48 is at least one-half to one inch less than the height $_5$ of disposable element 42.

As the build-up 40 of condensed aluminum chloride accumulates on the upper portion of outer trapping medium 48, as indicated in FIG. 2, the heat transfer from aluminum chloride gas molecules impinging such deposition build-up 40 becomes less efficient, because the deposition medium 40 itself does not conduct heat as well as the trapping medium 44, which is preferably metal. Therefore, with such build-up 40 on the upper portion of outer trapping medium 48, the effluent flow will then be gradually redirected in the direction shown by flow arrows 68, 70, and 72. Essentially, heat transfer, thus condensation, is initially is more efficient on outer trapping medium 48, and the condensation of aluminum chloride on the outer trapping medium 48, as described above, decreases partial pressure adjacent the outer trapping medium 48, thereby causing a decreasing partial pressure gradient of aluminum chloride gas with a resulting preferential flow of aluminum chloride gas toward the outer trapping medium 48, as indicated by flow arrows 64, 66. However, as solid aluminum chloride, builds up on outer trapping medium 48, heat transfer, thus condensation, becomes less efficient, and the resulting partial vapor pressure of aluminum chloride adjacent the solid aluminum chloride build-up 40 on outer trapping medium 48 increases to something more than the partial vapor pressure of aluminum chloride adjacent the inner screen column 52. Thus, the remainder of the effluent containing the condensable aluminum chloride vapor will be drawn through disposable element 42 in the directions indicated by flow arrows 68, 70, and 72 due to the influence of the and resulting partial pressure gradients, and will next increasingly into contact with inner cylindrical screen column 52, which is also part of the first deposition stage 200 of the disposable element 42, where a second large portion of condensable aluminum chloride vapor will condense and deposit as solid aluminum chloride build-up 41 in a manner similar to that discussed above for the build-up 40 on outer trapping medium 48. In this way the effluent gas flow is balanced and overall efficiency and longevity of trap 10 is increased.

After the effluent has come into contact with the first deposition stage 200 (i.e., upper portions of the outer trapping medium 48 and inner cylindrical screen column 52) of disposable element 42 and has deposited on outer trapping medium 48 and screen column 52 of disposible element 42 as discussed above, approximately 90–95% of the original condensable aluminum chloride vapor present in the effluent has deposited as solid aluminum chloride build-up 40,41 in the first deposition stage 200. The effluent containing the remaining 5 to 10% of the condensable aluminum chloride vapor then flows through and is condensed in the second deposition stage 205 of disposable element 42. The second deposition stage 205 comprises inner trapping medium 44 and middle trapping medium 46, each of which contain significantly more surface areas 210 for providing maximum heat exchange surfaces while still allowing for the flow of the effluent through trapping media 44 and 46, as indicated by flow arrows 74, 76, 78 and 80, under the influence of the vacuum. Thus, the densities and heights $h_4$ and $h_3$ of trapping media 44 and 46, respectively, are important to the efficient trapping of condensable aluminum chloride vapor. If trapping media 44 and 46 are not of sufficient density, the majority of the effluent would flow though trapping media 44, 46 under the influence of the vacuum, resulting in inefficient trapping of condensable aluminum chloride vapor, thereby allowing the condensable aluminum chloride vapor to pass through the trap 10 and condense, solidify, and accumulate in exhaust lines 18 and 32 downstream of trap 10. Preferably, the density of trapping medium 44 is approximately 10 $in^2/in^3$, and the density of trapping medium 46 is approximately 8 $in^2/in^3$, as described below in detail.

As discussed above, the height $h_2$ of inner cylindrical screen column 52 preferably space from the inlet opening 35 such that only a minimum amount of aluminum chloride is deposited near the inlet opening 35 in order to avoid clogging of the inner core. Preferably, the height $h_2$ of inner cylindrical screen column 52 is approximately 0.5 $h_5$ to 0.99 $h_5$, preferably about ⅔ $h_5$, where $h_5$ is the height of housing 60. Outer trapping medium 48 preferably has a height $h_1$ that is just about the same as, or is just slightly less than the height $h_5$ of housing 60. Essentially, the protective shield 53 should be of sufficient height to provide protection of the interior surface of housing 60 but is not of a height that would prohibit closing and sealing housing 60.

As indicated above, trapping media 44 and 46 of the second deposition stage 205 are of sufficient density to provide enough surface areas to trap the remaining condensable aluminum chloride vapor (approximately 5–10% or less) in the effluent after the effluent has passed through the first deposition stage 200 of disposable element 42, but at the same time trapping media 44 and 46 are not so dense as to impede the flow of the effluent through trapping media 44 and 46. Therefore the remaining condensable aluminum chloride vapor is able to flow through and deposit within trapping media 44 and 46, as indicated by flow arrows 74, 76 and 78. Further, trapping media 44 and 46 have a greater surface areas and therefore a greater capacity to trap the remaining condensable aluminum chloride vapor (approximately 5–10% or less) in the effluent. Thus, disposable element 42 of trap 10 may be designed to maximize the trapping efficiency of condensable aluminum chloride vapor, such that the majority of the deposition 40 and 41 occurs in the primary stage so that the denser trapping media 44 and 46 won't become clogged after a short period of time, and so vacuum pump 16 will be able to pull a vacuum through disposable element 42 for a greater length of time while efficiently trapping the condensable aluminum chloride vapor. In addition, the denser trapping media 44 and 46 are sufficiently dense such that trapping media 44 and 46 are able to efficiently trap the remaining condensable aluminum chloride vapor (approximately 5–10% or less) in the effluent that was not trapped in the first stage 200 of trap 10.

Thus, a significant feature of disposable element 42 of trap 10 is that the deposition of aluminum chloride solids can be manipulated by varying the heights and densities of trapping media 44, 46, 48 and the height of inner cylindrical screen column 52 in order to maximize the amount of aluminum chloride solids that can be trapped before disposable element 42 can no longer efficiently trap condensable aluminum chloride vapor, such that the etch chamber 14 can be operated for a substantial period of time before it is necessary to replace disposable element 42 laden with aluminum chloride deposits with a new disposable element 42.

As a result of the efficient trapping of aluminum chloride by disposable element 42 of trap 10, the effluent exiting outlet opening 114 (flow arrow 84), is essentially free of condensable aluminum chloride vapor. Consequently, it is not necessary to heat any of the lines, pumps, valves, or other parts of the vacuum system downstream of trap 10 to prevent condensation of aluminum chloride vapor in those components.

As discussed briefly above, the trapping media 44, 46, 48 comprises a sufficient density of microsurfaces 210 to cool, condense, and solidify substantially all of the aluminum chloride vapor in the effluent. At the same time, the microsurfaces 210 are not so dense as to inhibit the ability of the vacuum pump to maintain the required vacuum in the reaction furnace 14. In other words, excess reaction gas molecules such as $Cl_2$ or $BCl_3$ should be able to pass substantially unimpeded through the trapping media 44, 46, 48.

A preferred, but not essential, embodiment of the trapping media 44, 46, 48 comprises a mesh 130 of one or more layers of crimped metal fabric made with intertwined or interlaced metal wire 134 to form a maze or tangle of metal microsurfaces as illustrated in FIGS. 9–12 and 16 and in more detail in the enlarged section of such trapping media in FIG. 9. As stated above, trapping media 44 and 46 are denser than trapping medium 48. Consequently, in the following discussion it is to be understood that while the general characteristics of the mesh 130 apply to all trapping media 44, 46, and 48, preferably the density of trapping medium 46 is less than the density of trapping medium 44, and preferably the density of trapping medium 48 is less than the density of trapping medium 46.

As shown in FIG. 9, the mesh 130 that forms the preferred embodiment trapping media is comprised of a loose tangle of intertwined or interlaced metal wires 134. The word "tangle" as used herein does not imply that the wires are not assembled or laced in an ordered manner or pattern, but only that they are shaped and positioned in a manner that substantially prevents condensable aluminum chloride vapor from flowing straight through the trapping medium without contacting the trapping medium, resulting in the condensable aluminum chloride vapor being cooled and condensing as a solid on the trapping medium.

In the preferred embodiment of trapping media 44, 46, 48, the tangle of wires 134 provides enough surface area in the transverse thickness t so that substantially all aluminum chloride gas molecules are not only cooled, but also condensed as solids and retained on wires 134. Of course, too many wires 134 in the thickness t of the trapping media would impede flow of other gas molecules such as the chlorinated reaction gas molecules, and thus interfere with the ability of the vacuum pump to maintain the required vacuum in the chamber, as described above.

Figure 16:
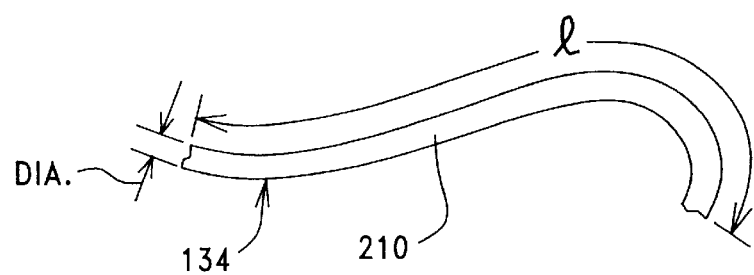
FIG. 16 is an enlarged view of a segment of a wire in the preferred embodiment mesh trapping media shown in FIG. 9.

Accordingly, a significant feature of this invention is to place enough wire 134 in the mesh 130 to provide a density (Surface Area/Unit Volume) in a range of about 2 $in^2/in^3$ to 15 $in^2/in^3$, preferably about 8 $in^2/in^3$. In other words, in each cubic-inch volume of mesh 130, there is about 2 $in^2$ to 15 $in^2$, preferably about 8 $in^2$, of surface area. The surface area $A_s$ for a cylindrical wire 134 in the mesh 130, can be determined by the formula in Equation (3):

$$A_s = (\pi) \times (dia.) \times l \quad (3)$$

where (dia.) is the diameter of the wire 134 and l is the length of the wire 134 in a volume of mesh 130 (see also FIG. 16).

Stainless steel wire 134 is preferred, but other common metals, such as copper, bronze, and aluminum would also provide satisfactory condensation and trapping of condensable aluminum chloride vapor molecules, as would ceramic strands or threads in a mesh 130. While wire 134 with circular cross-section is preferred, mostly because of its availability, strips of wire 134 with flat or other cross-sections could be used to provide the micro-surface density within the range described above.

Figure 10:
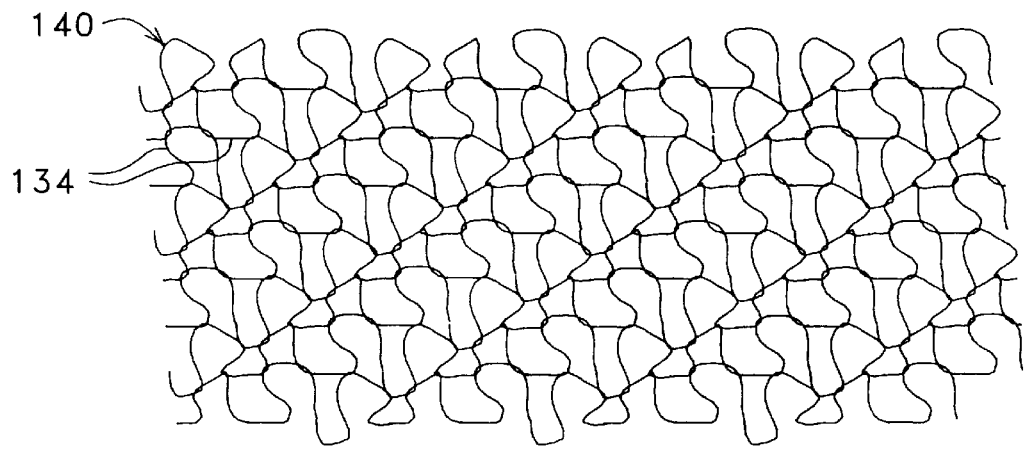
FIG. 10 is an elevation view of a single layer of an interlaced metal fabric mesh used in the preferred trapping media according to this invention.
Figure 11:
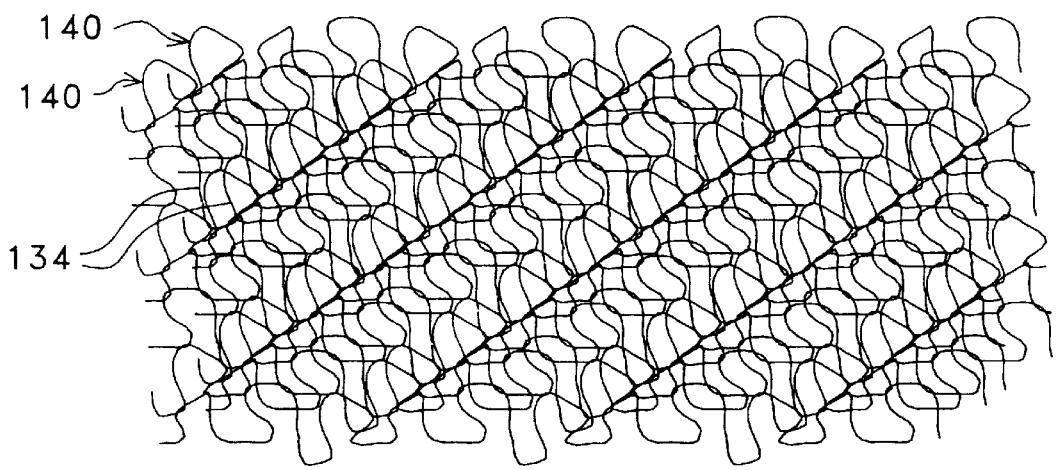
FIG. 11 is an elevation view of two layers of the interlaced metal fabric mesh of FIG. 10 laminated together.
Figure 12:
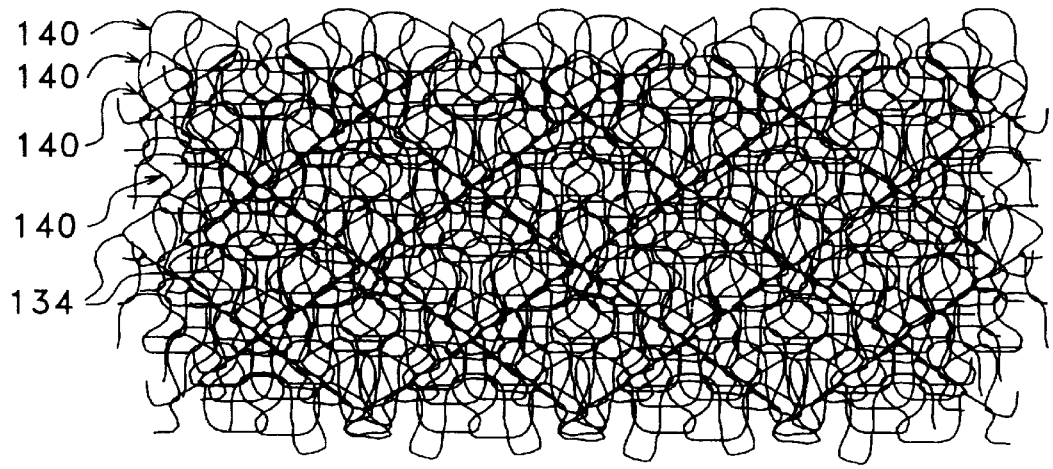
FIG. 12 is an elevation view of four layers of the interlaced metal fabric mesh of FIG. 10 laminated together.

An example of a single layer of crimped wire fabric 140 is shown in FIG. 10, wherein strands of the wire 134 are interlaced to form the open, single layer metal fabric 140. The density of metal fabric 140 can be increased by stacking or laminating multiple layers of such metal fabric 140 together, as shown in FIG. 11. Even greater density can be obtained by stacking or laminating four layers metal fabric 140 together, as illustrated in FIG. 12.

Figure 13:
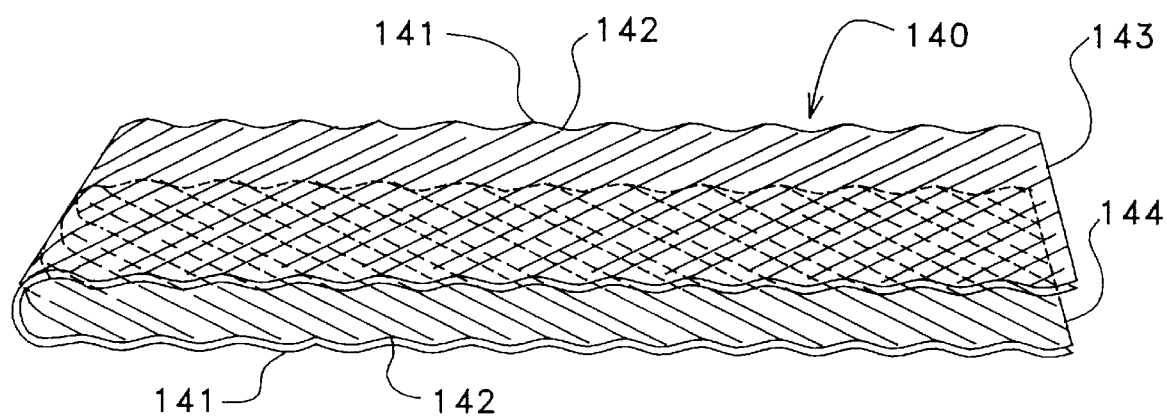
FIG. 13 is a diagrammatic view of a strip of the interlaced metal fabric mesh of FIG. 10 folded over on itself to make two layers laminated together.
Figure 14:
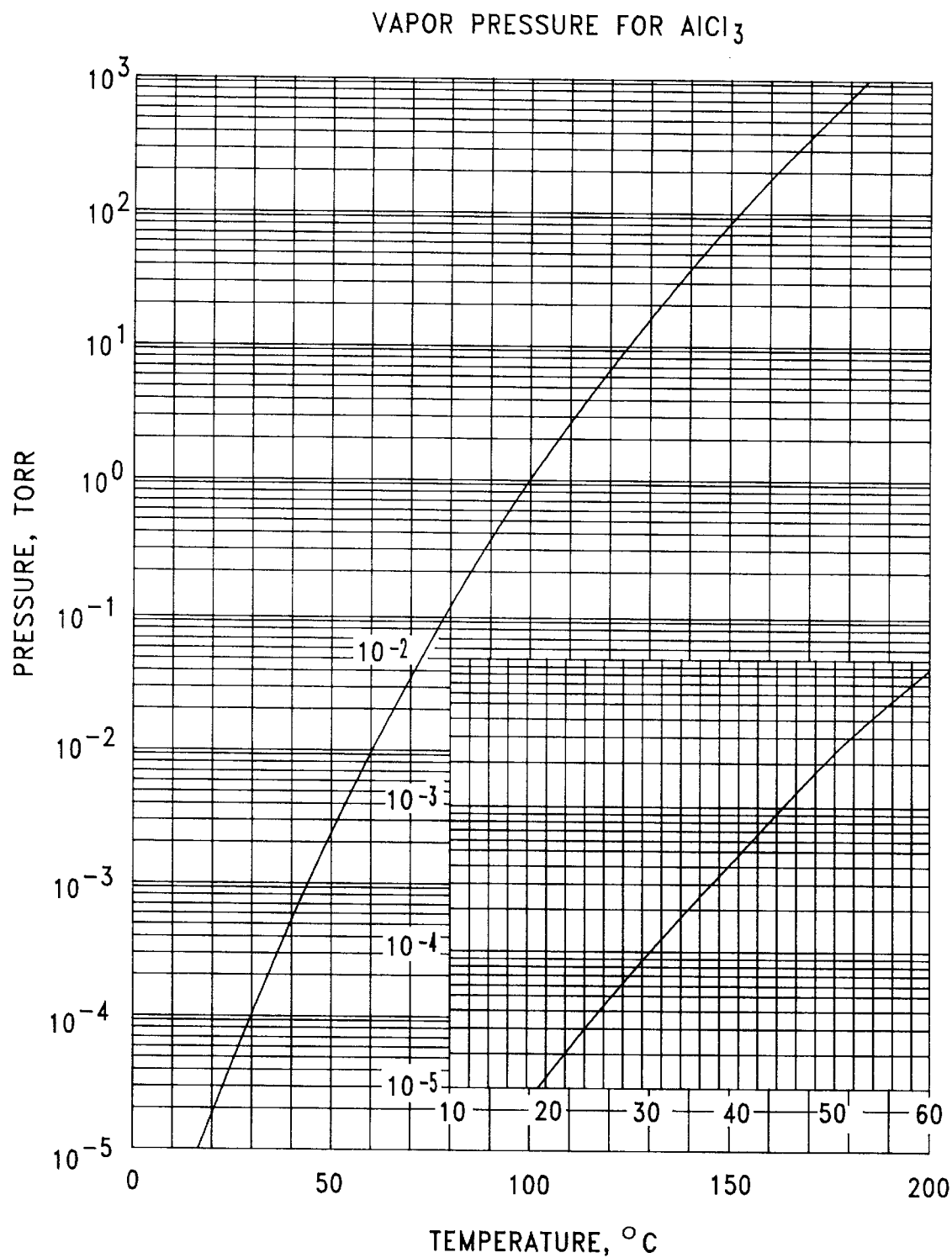
FIG. 14 is a graph of the vapor pressure curve for aluminum chloride ($AlCl_3$)

The preferred embodiment mesh 130 for the trapping media 44, 46, 48 can, therefore, be fabricated quite easily by stacking together layers of the metal fabric 140 until the desired density is attained. For example, but not for limitation, a long strip of the metal fabric 140 can be folded over on itself, as shown in FIG. 13, to create a double density stack similar to that shown in FIG. 11. The metal fabric 140 can also be crimped to add some three-dimensional depth to the fabric 140, as indicated by the crimped convex and concave bends 141, 142, respectively, in FIG. 13. Further, when the crimped bends 141, 142 are formed diagonally, as shown in FIG. 13, the concave bends 142 of the top layer 143 bridge against the concave bends 142 of the bottom layer 144 to maintain the three-dimensional depth of the composite of the two layers 143, 144, which creates a higher surface density than if the two metal fabric layers were not crimped.

It follows, therefore, that the surface density of the composite mesh 130 can be a function of the sharpness or depth from convex bends 141 to adjacent concave bends 142. The folded composite metal fabric 140 of FIG. 13, can then be rolled as many turns as necessary to make the desired thickness t of the mesh 130 trapping media as described above. Of course, any of the finished trapping media may have the metal fabric 140 wrapped as tightly as desired.

Preferably, trapping medium 44 has a height $h_4$ in a range of about 1 to 3 inches, preferably about 2 inches and a transverse thickness $t_3$ in a range of about 1 to 3 inches, preferably about 2 inches. Trapping medium 46 preferably has a height $h_3$ in a range of about 3 to 5 inches, preferably about 4 inches and a transverse thickness $t_2$ in a range of about 1 to 4 inches, preferably about 2.5 inches. Trapping medium 48 preferably has a height $h_1$ in a range of about six to ten inches, preferably about eight inches and a transverse thickness $t_1$ in a range of about 0.1 to 1 inch, preferably about 0.5 in. Such sizing of trapping media 44, 46, 48 provides a disposable element 42 having a diameter $d_4$ in a range of about four to eight inches, preferably about 4.75 inches, which, with a micro-surface density in the range described above, provides for the trapping capacity for aluminum chloride molecules, while allowing conductance of other gas molecules, to prevent downstream deposition of aluminum chloride solids. In order for disposable element 42 to fit into housing 60 of trap 10, it is necessary that the diameter $d_4$ of disposable element be slightly smaller than the inside diameter D of chamber 90. Consequently, a narrow annular space 148 may be present between solid shield 53 and inside surface of side wall 124 of housing 60. Preferably, annular space 148 is less than one-eighth to one-sixteenth of an inch.

Further, it is preferred that the distance of upper surface 85 of trapping medium 44 from chamber inlet end 92 be approximately the same as the distance of the upper surface 86 of trapping medium 46 from chamber inlet end 92. Of course the height $h_4$ of trapping medium 44 will depend on the size of guide 120.

Solid gas-impervious shield 53 primarily serves to protect the interior surface housing 60 from deposition of aluminum chloride as well as to provide structural support to disposable element 42, and therefore is preferably a solid, stainless steel metal having a height $h_5$ that is sufficiently high to substantially block effluent molecules from reaching inner surface of side wall 124 of housing 60, but is not of a height that would prevent disposable member 42 from fitting into housing 60.

An alternative mounting position of trap 10 is shown in FIG. 15, in which trap 10 placed along exhaust pipe line 32 downstream of pump 16. In this embodiment, all components upstream of trap 10, such as foreline 12, pump 16, and all other components such as valves, etc., must be heated to prevent deposition of aluminum chloride solids in such components. In addition, since nitrogen ($N_2$) is added to pump 16 via nitrogen inlet 150 in order to improve the pump performance, part of the aluminum chloride will be condensed as a fine powder because of gas phase precipitation 165, rather than the more manageable solid deposit 40. This fine powder can be difficult to contain, and consequently a trap such as Y-shaped trap 160 may be necessary to collect the fine powder aluminum chloride. The powder 165 will fall down trap 160, while the effluent will flow on to scrubber 37.

While such installation as that shown in FIG. 15 with the trap 10 positioned post-pump, is not as desirable, such installations as that illustrated in FIG. 15 are still very effective at aluminum chloride deposition and removal.

The foregoing description is considered as illustrative only of the principles of the invention. The words "comprise," "comprising," "include," "including," and "includes" when used in this specification and in the following claims are intended to specify the presence of stated features, integers, components, or steps, but they do not preclude the presence or addition of one or more other features, integers, components, steps, or groups thereof. Furthermore, since a number modifications and changes will readily occur to those skilled in the art, it is not desired to limit the invention to the exact construction and process shown described above. Accordingly, all suitable modifications and equivalents may be resorted to falling within the scope of the invention as defined by the claims which follow.

The embodiments of the invention in which an exclusive property or privilege is claimed are defined as follows:

1. Trap apparatus for removing a condensable constituent from a gaseous flow, comprising:
    a housing enclosing a trap chamber, said housing having an upstream end wall with an inlet opening and a downstream end wall with an outlet opening;
    an annular outer trapping medium positioned in the trap chamber and spaced radially outward from the inlet opening;
    an inner screen column extending from a lower end at the downstream end wall upwardly into the trap chamber toward, but not all the way to, the upstream end wall such that the inner screen terminates at an upper end spaced axially downstream from the inlet opening, said inner screen column being spaced radially inward from the outer trapping medium and surrounding an inner core space that is open at said upper end such that there is an annular space between the inner screen column and the annular outer trapping medium;
    a core trapping medium disposed in the inner core and extending upwardly toward, but not all the way to, the upper end of the inner screen column; and
    an intermediate trapping medium disposed in the annular space between the inner screen column and the outer trapping medium and extending upwardly toward, but not all the way to, the upper end of the inner screen column.

2. The trap apparatus of claim 1, wherein said outer trapping medium comprises metal wire mesh, said core trapping medium comprises metal wire mesh, and said intermediate trapping medium comprises metal wire mesh.

3. The trap apparatus of claim 2, wherein the metal wire mesh of said outer trapping medium is less dense than the metal wire mesh of the core trapping medium.

4. The trap apparatus of claim 2, wherein the metal wire mesh of said outer trapping medium is less dense than the metal wire mesh of the intermediate trapping medium.

5. The trap apparatus of claim 2, wherein said metal wire is intertwined or interlaced to form a metal fabric and said mesh comprises multiple layers of said metal fabric.

6. The trap apparatus of claim 2, wherein said metal wire is stainless steel.

7. The trap apparatus of claim 2, wherein said mesh has a surface density (Surface Area/Unit Volume) in a range of about 2 to 15 $in^2/in^3$.

8. The trap apparatus of claim 7, wherein said core trapping medium is disposed between said intermediate trapping medium and said outlet opening.

9. The trap apparatus of claim 1, including a gas-impervious shield disposed between the outer trapping medium and the housing.

10. The trap apparatus of claim 9, wherein said shield is solid metal.

11. The trap apparatus of claim 9, wherein said housing has a height and wherein said shield has a height about the same as the height of the housing.

12. The trap apparatus of claim 1, wherein said housing has a length and wherein said second trapping medium has a length that is about one third to one half the length of said housing.

13. The trap apparatus of claim 1, wherein said inner screen column comprises a wire screen.

14. The trap apparatus of claim 13, wherein said wire screen is a 4×4 to 8×8 mesh screen.

15. The trap apparatus of claim 1, wherein the outer trapping medium, the inner screen column, the core trapping medium, and the intermediate trapping medium together form a disposable element.

16. The trap apparatus of claim 15, wherein said housing further comprises a guide for centering and anchoring said disposable element in said housing.

17. The trap apparatus of claim 16, wherein said inner screen column is positioned over said guide.

18. The trap apparatus of claim 15, wherein said disposable element is removable from said chamber and replaceable with another disposable element.

19. The trap apparatus of claim 15, wherein said disposable element has a height and wherein said outer trapping medium has a height of about one-half to one inch less than the height of the disposable element.

20. The trap apparatus of claim 19, wherein said inner trapping medium has a transverse thickness, wherein said intermediate trapping medium has a transverse thickness, wherein said outer trapping medium has a transverse thickness, wherein the transverse thickness of said outer trapping medium is about one-fifth of the transverse thickness of said intermediate trapping medium and about one-fourth of the thickness of said core trapping medium.

21. The trap apparatus of claim 20, wherein said outer trapping medium has a transverse thickness in the range of about 0.1 to 1 inches, wherein said intermediate trapping medium has a transverse thickness in the range of about 1 to 4 inches, and wherein said core trapping medium has a transverse thickness in the range of about 1 to 3 inches.

22. The trap apparatus of claim 21, wherein said outer trapping medium has a transverse thickness of about 0.5 inches, wherein said intermediate trapping medium has a transverse thickness of about 2.5 inches, and wherein said inner trapping medium has a transverse thickness of about 2 inches.

23. The trap apparatus of claim 15, wherein said trap chamber has a diameter and wherein said disposable element has a diameter that is less than the diameter of the trap chamber.

24. The trap apparatus of claim 23, wherein an annular space defined by the difference in the diameter of the trap chamber and the diameter of the disposable element is less than about ⅛ to 1/16 of an inch.

25. The trap apparatus of claim 1, wherein said housing is an elongated cylinder.

26. The trap apparatus of claim 1, wherein the lower end of the inner screen column surrounds the outlet opening.

27. The trap apparatus of claim 1, wherein said housing has a height and wherein said inner screen column has a height of at least about one-half of the height of the housing.

28. The trap apparatus of claim 27, wherein said intermediate trapping medium has a height and wherein said core trapping medium has a height of about one-half of the height of the intermediate trapping medium, and wherein the height of the intermediate trapping medium is about one-half of the height of the outer trapping medium.

29. The trap apparatus of claim 28, wherein said core trapping medium has a height in a range of about 1 to 3 inches, wherein said intermediate trapping medium has a height in the range of about 3 to 5 inches, and wherein said outer trapping medium has a height in the range of about 6 to 10 inches.

30. The trap apparatus of claim 29, wherein said core trapping medium has a height of about 2 inches, wherein said intermediate trapping medium has a height of about 4 inches, and wherein said outer trapping medium has a height of about 8 inches.

31. The trap apparatus of claim 27, wherein the height of the inner screen column is about two-thirds of the height of the housing.

32. Trap apparatus for removing a condensable constituent from a gas flow, comprising:
   a housing enclosing a trap chamber, said housing having an inlet end wall with an inlet opening and an outlet end-wall with an outlet opening, and said trap chamber having a first trapping stage adjacent the inlet opening and a second trapping stage adjacent the outlet opening;
   wherein said first trapping stage includes first stage trapping media comprising:
      (i) an annular outer trapping medium positioned in radially outward spaced relation to the inlet opening; and
      (ii) an annular screen column positioned in radially inward spaced relation to the annular outer trapping medium and extending toward, but no tall the way to, the inlet opening such that there is an annular space around the screen column in the first trapping stage between the annular screen column and the annular outer trapping medium; and
   wherein said second trapping stage includes second stage trapping medium positioned between the first trapping stage and the outlet so that gas flowing from the inlet to the outlet has to flow through the second stage trapping medium.

33. The trap apparatus of claim 32, wherein said second trapping stage medium includes:
   an extension of the annular screen column of the first trapping stage into the second trapping stage toward the outlet; and
   a core trapping medium in a portion of the annular screen column that extends into the second trapping stage.

34. The trap apparatus of claim 33, wherein said second stage trapping medium also includes:
   an extension of the annular outer trapping medium from the first trapping stage into the second trapping stage in radially outward spaced relation to the portion of the annular screen column that extends into the second trapping stage such that there is an annular space between the extension of the outer trapping medium in the second trapping stage and the extension of the screen column in the second trapping stage; and
   an intermediate trapping medium positioned in the annular space between the extension of the outer trapping medium in the second trapping stage and the extension of the screen column in the second trapping stage.

35. The trap apparatus of claim 34, including a gas impervious outer shield positioned around the annular outer trapping medium between the annular outer trapping medium and the housing.

* * * * *